United States Patent
Park et al.

(10) Patent No.: US 8,169,074 B2
(45) Date of Patent: May 1, 2012

(54) SEMICONDUCTOR DEVICES INCLUDING FIRST AND SECOND SILICON INTERCONNECTION REGIONS

(75) Inventors: Jong-Man Park, Hwaseong-si (KR); Santoru Yamada, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 3 days.

(21) Appl. No.: 12/827,375

(22) Filed: Jun. 30, 2010

(65) Prior Publication Data

US 2011/0020993 A1 Jan. 27, 2011

(30) Foreign Application Priority Data

Jul. 23, 2009 (KR) .................. 10-2009-0067466

(51) Int. Cl.
*H01L 23/48* (2006.01)
(52) U.S. Cl. ........ 257/734; 438/243; 438/386; 438/231; 257/296; 257/369; 257/377; 257/E21.637; 257/E27.062
(58) Field of Classification Search ........... 257/E21.616, 257/E21.637, E27.062, 369; 438/275, 243, 438/155
See application file for complete search history.

(56) References Cited

U.S. PATENT DOCUMENTS

| | | | |
|---|---|---|---|
| 5,502,320 A * | 3/1996 | Yamada | 257/302 |
| 5,631,188 A * | 5/1997 | Chang et al. | 438/253 |
| 5,686,329 A * | 11/1997 | Chang et al. | 438/253 |
| 6,022,794 A * | 2/2000 | Hsu | 438/526 |
| 6,281,540 B1 | 8/2001 | Aoki | |
| 6,429,068 B1 * | 8/2002 | Divakaruni et al. | 438/243 |
| 6,440,783 B2 * | 8/2002 | Wong | 438/155 |
| 6,448,610 B2 | 9/2002 | Weis | |
| 6,528,835 B1 * | 3/2003 | Kaeriyama | 257/296 |
| 6,828,624 B1 | 12/2004 | Goda et al. | |
| 2001/0025973 A1 | 10/2001 | Yamada et al. | |
| 2006/0284232 A1 | 12/2006 | Hong et al. | |
| 2007/0004119 A1 | 1/2007 | Chun | |
| 2007/0045712 A1 | 3/2007 | Haller et al. | |
| 2007/0278586 A1 * | 12/2007 | Chen et al. | 257/369 |
| 2008/0048333 A1 | 2/2008 | Seo et al. | |
| 2008/0111155 A1 | 5/2008 | Capasso et al. | |
| 2008/0265332 A1 * | 10/2008 | Moriwaki | 257/369 |
| 2010/0193880 A1 | 8/2010 | Yoshida et al. | |

FOREIGN PATENT DOCUMENTS

| | | |
|---|---|---|
| JP | 07-066297 | 3/1995 |
| JP | 10-242422 | 9/1998 |
| JP | 2001-068643 | 3/2001 |
| JP | 2004534403 | 11/2004 |
| KR | 10-2001-0005233 A | 1/2001 |
| KR | 10-2001-0088445 A | 9/2001 |
| KR | 1020040012972 A | 2/2004 |

(Continued)

*Primary Examiner* — Thao Le
*Assistant Examiner* — Sheng Zhu
(74) *Attorney, Agent, or Firm* — Myers Bigel Sibley & Sajovec, P.A.

(57) ABSTRACT

Provided are a semiconductor device and a method of fabricating the same. The semiconductor device includes a first interconnection disposed on a substrate. The interconnection includes a first silicon interconnection region and a first metal interconnection region sequentially stacked on the substrate. A second interconnection includes a second silicon interconnection region and a second metal interconnection region that are stacked sequentially. The second silicon interconnection region has a lower resistivity than the first silicon interconnection region.

20 Claims, 34 Drawing Sheets

FOREIGN PATENT DOCUMENTS

| | | |
|---|---|---|
| KR | 10-2006-0035609 A | 5/2006 |
| KR | 10-2006-0038609 A | 5/2006 |
| KR | 10-2006-0131516 A | 12/2006 |
| KR | 10-2007-0001588 A | 1/2007 |
| KR | 1020090029637 A | 3/2009 |

* cited by examiner

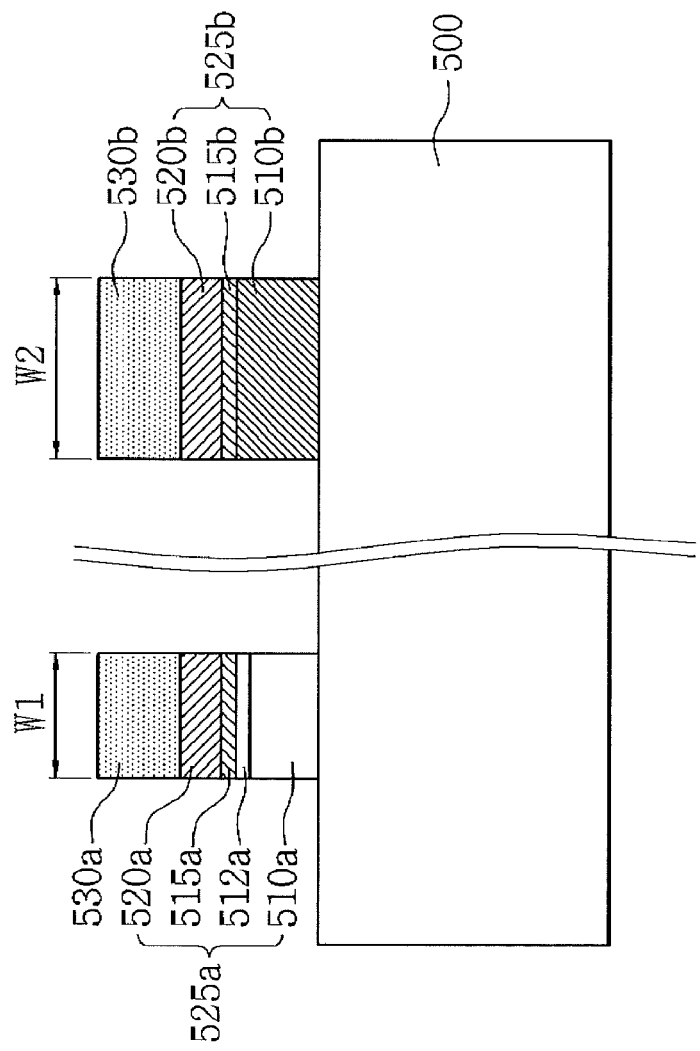

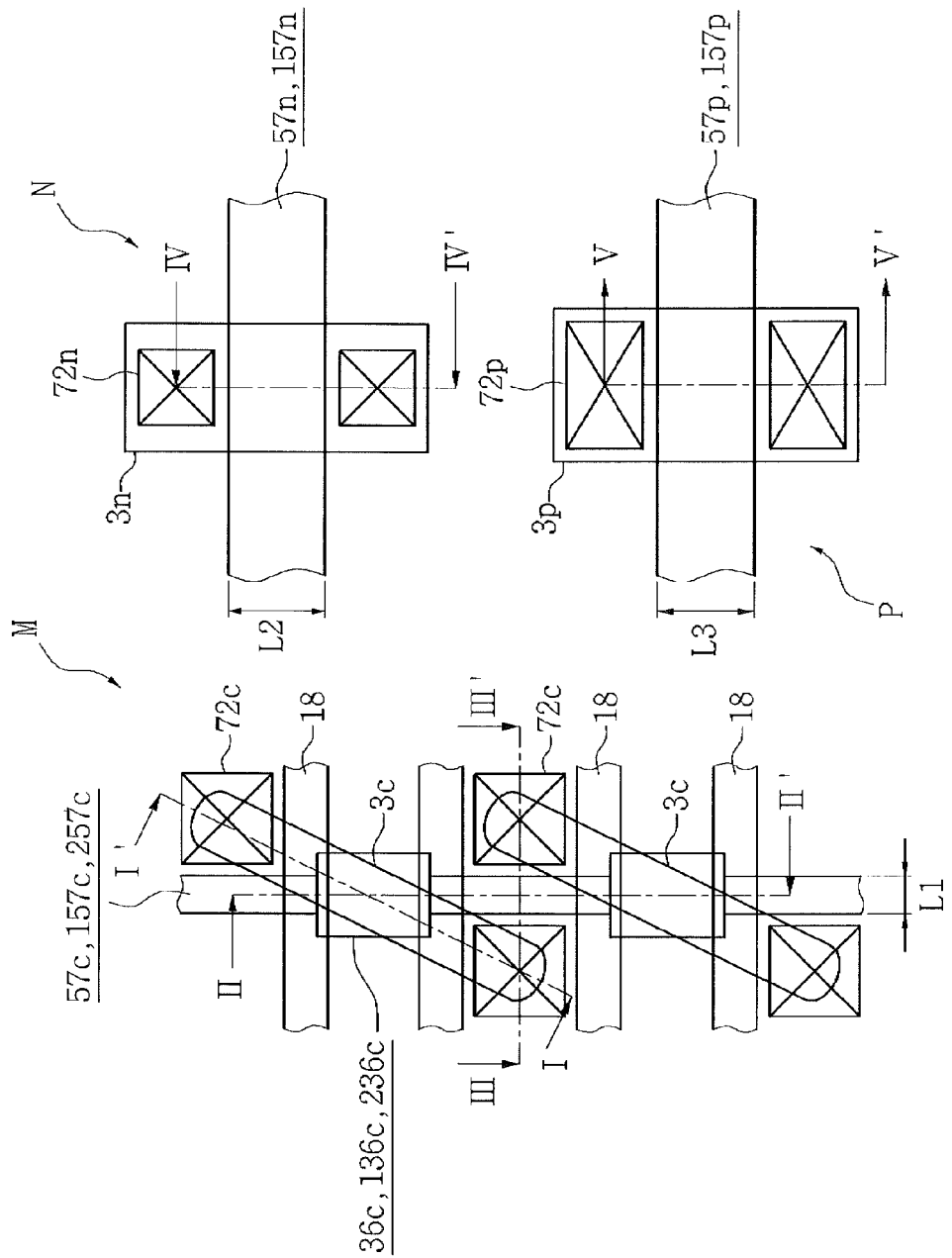

SEMICONDUCTOR DEVICES INCLUDING FIRST AND SECOND SILICON INTERCONNECTION REGIONS

REFERENCE TO PRIORITY APPLICATION

This application claims priority to Korean Patent Application No. 10-2009-0067466, filed Jul. 23, 2009, the contents of which are hereby incorporated herein by reference.

FIELD OF THE INVENTION

This invention relates to semiconductor devices and, more particularly, to semiconductor devices having interconnections with different electrical properties and methods of fabricating the same.

BACKGROUND

As the integration density of semiconductor devices increases, the dimension of discrete devices is decreasing and the width of interconnections and intervals between the interconnections are decreasing. Thus, the transmission rate of electrical signals applied to the interconnections may be reduced due to an increase in an electrical resistance or parasitic capacitance of the interconnections.

SUMMARY

Example embodiments provide a semiconductor device including interconnections with different electrical properties and a method of fabricating the same.

According to example embodiments, a semiconductor device having interconnections with different electrical properties includes a first interconnection disposed on a substrate. The first interconnection includes a first silicon interconnection region and a first metal interconnection region stacked sequentially on the substrate. A second interconnection includes a second silicon interconnection region and a second metal interconnection region stacked sequentially on the substrate. The second silicon interconnection region is disposed at substantially the same level as the first silicon interconnection region. The second silicon interconnection region has a lower resistivity than the first silicon interconnection region.

In some example embodiments, the first silicon interconnection region may be formed of undoped silicon or intrinsic silicon, and the second silicon interconnection region may be formed of doped silicon.

In other example embodiments, the first and second silicon interconnection regions may be formed of doped silicon of the same conductivity type, and the second silicon interconnection region may be formed of doped silicon having a higher dopant concentration than the first silicon interconnection region.

In other example embodiments, the semiconductor device may further include a doped silicon buffer region interposed between the first silicon interconnection region and the first metal interconnection region. The doped silicon buffer region may have a lower resistivity than the first silicon interconnection region.

In other example embodiments, the first silicon interconnection region may have a smaller width than the second silicon interconnection region.

According to other example embodiments, a semiconductor device adopting a silicon interconnection region and a metal interconnection region includes a semiconductor substrate having first and second circuit regions. A first MOS transistor is disposed on the first circuit region of the semiconductor substrate. The first MOS transistor includes a first gate structure and first source and drain regions. A contact region is electrically connected to one of the first source and drain regions. A first silicon interconnection is connected to the contact region. The first silicon interconnection has a higher resistivity than the contact region. A first metal interconnection region is disposed on the contact region and the first silicon interconnection region. A second silicon interconnection region is disposed on the second circuit region of the semiconductor substrate. The second silicon interconnection region has a lower resistivity than the first silicon interconnection region. A second metal interconnection region is disposed on the second silicon interconnection region. The second metal interconnection region is formed of the same material as the first metal interconnection region.

In some example embodiments, the first MOS transistor may include first source and drain regions and a first gate structure. The first source and drain regions may be disposed in a first active region defined by an isolation region formed in the semiconductor substrate. The first source and drain regions may be spaced apart from each other. The first gate structure may partially fill a gate trench that runs across an active region between the first source and drain regions and extends to the isolation region.

Also, the first gate structure may partially fill the gate trench disposed across the first active region and extend to the isolation region to cover sidewalls of the first active region at a lower level than a bottom region of the gate trench of the first active region.

In other example embodiments, the semiconductor device may further include a second MOS transistor disposed on the second circuit region of the semiconductor substrate. The second MOS transistor may include a second gate structure and second source and drain regions. The second MOS transistor includes a second gate dielectric layer, a second gate structure, and second source and drain regions. The second gate dielectric layer and the second gate structure may be sequentially stacked on a second active region defined by the isolation region disposed in the semiconductor substrate. The second source and drain regions may be disposed in the second active region on both sides of the second gate structure. The second gate structure may include the second silicon interconnection region and the second metal interconnection region. The second silicon interconnection region may be disposed at substantially the same level with the first silicon interconnection region. Meanwhile, the first interconnection may be disposed at substantially the same level with the second gate structure.

The first and second silicon interconnection regions may be formed of doped silicon of the same conductivity type. The second silicon interconnection region may be formed of doped silicon having a higher dopant concentration than the first silicon interconnection region.

In other example embodiments, the contact region may be formed of doped silicon or the same material as the first metal interconnection region.

In other example embodiments, the first silicon interconnection region may be formed of undoped silicon or intrinsic silicon.

In other example embodiments, the semiconductor device may further include a doped silicon buffer region interposed between the first silicon interconnection region and the first metal interconnection region. The doped silicon buffer region may have a lower resistivity than the first silicon interconnection region.

According to other example embodiments, a method of fabricating a semiconductor device includes preparing a semiconductor substrate having first and second circuit regions. An isolation region is formed in the semiconductor substrate to define a first active region and a second active region in the first and second circuit regions, respectively. A second gate dielectric layer is formed on the second active region. A first silicon layer having a first resistivity is formed on the entire surface of the semiconductor substrate having the second gate dielectric layer. First impurity ions are implanted into the first silicon layer formed on the second circuit region to form a second silicon region having a second resistivity lower than the first resistivity. A metal layer is formed on the semiconductor substrate having the second silicon region. The first silicon layer, the second silicon region, and the metal layer are patterned to form a first interconnection and a second interconnection. The first interconnection includes a first silicon pattern and a first metal pattern stacked sequentially on the first circuit region, and the second interconnection includes a second silicon pattern and a second metal pattern stacked sequentially on the second circuit region.

In some example embodiments, the first silicon layer may be formed of one selected from the group consisting of undoped silicon, intrinsic silicon, and doped silicon.

In other example embodiments, the method may further include forming a first MOS transistor on the first circuit region of the semiconductor substrate. The first MOS transistor may include a first gate structure and first source and drain regions. The first gate structure may be formed in a gate trench that runs across the first active region and extends to the isolation region. The first source and drain regions may be formed in the first active region on both sides of the gate trench.

Meanwhile, the first silicon pattern may be connected to one of the first source and drain regions.

During the formation of the second silicon region, the method may further include implanting the first impurity ions into a portion of the first silicon layer that overlaps a predetermined region of the first active region to form a silicon contact region having the same conductivity type and dopant concentration as the second silicon region. The silicon contact region may be left during the patterning of the first silicon layer and electrically connected to one of the first source and drain regions.

Before the formation of the metal layer, the method may further include patterning the first silicon layer to form an opening exposing one of the first source and drain regions; and forming a contact region to fill the opening. The contact region may be formed of doped silicon having a lower resistivity than the first silicon layer.

Meanwhile, the method may further include: patterning the first silicon layer to form an opening exposing one of the first source and drain regions before the formation of the metal layer; and forming a contact region to fill the opening during the formation of the metal layer. The contact region may be formed by filling the opening with the metal layer.

In other example embodiments, the method may further include implanting impurity ions into an upper region of the first silicon layer disposed on the first circuit region to form a doped silicon buffer region having a lower resistivity than the first silicon layer.

In other example embodiments, the first silicon pattern may be formed to a smaller width than the second silicon pattern.

BRIEF DESCRIPTION OF THE DRAWINGS

FIG. 1 is a cross-sectional view of a semiconductor device according to example embodiments.

FIG. 2 is a plan view of a semiconductor device according to example embodiments.

DETAILED DESCRIPTION OF THE EMBODIMENTS

Figure 3A:
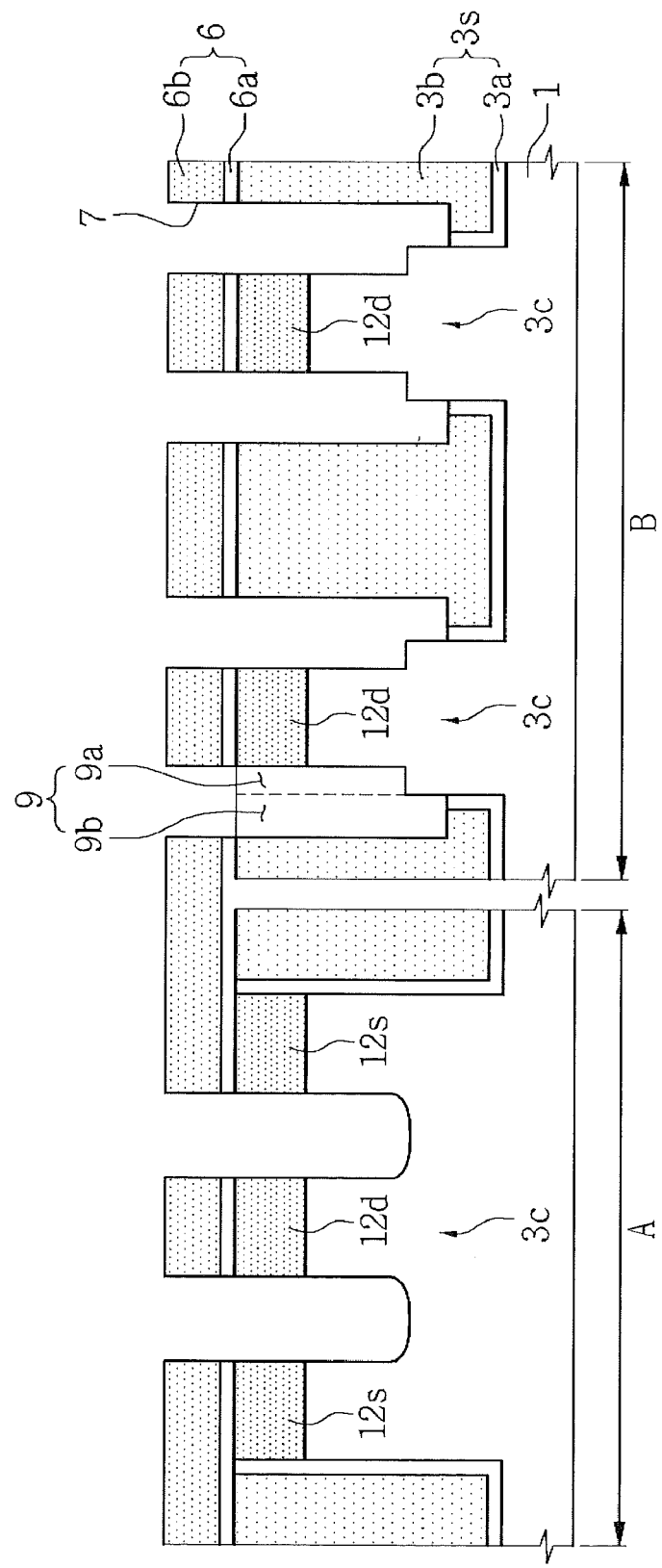
FIGS. 3A through 12B are cross-sectional views illustrating a method of fabricating a semiconductor device according to example embodiments.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

FIG. 1 is a cross-sectional view of a semiconductor device according to example embodiments.

Referring to FIG. 1, a semiconductor substrate 500 may be provided. A first interconnection 525a having a first linewidth W1 may be provided on the semiconductor substrate 500. A second interconnection 525b may be disposed on the semiconductor substrate 500. The second interconnection 525b may be spaced apart from the first interconnection 525a and have a second linewidth W2 greater than the first linewidth W1. The first and second interconnections 525a and 525b may be disposed at substantially the same level. A first capping mask 530a may be disposed on the first interconnection 525a, while a second capping mask 530b may be disposed on the second interconnection 525b. The first and second capping masks 530a and 530b may be formed of an insulating material, such as a silicon oxide layer or a silicon nitride layer.

The first interconnection 525a may include a first silicon interconnection region 510a and a first metal interconnection region 520a that are stacked sequentially. The second interconnection 525b may include a second silicon interconnection region 510b and a second metal interconnection region 520b that are stacked sequentially. The first and second metal interconnection regions 520a and 520b may be formed of the same material. For example, the first and second metal interconnection regions 520a and 520b may be formed of a metal, such as W.

The second silicon interconnection region 510b may have a lower resistivity than the first silicon interconnection region 510a. For example, when the first silicon interconnection region 510a is formed of undoped silicon or intrinsic silicon, the second silicon interconnection region 510b may be formed of doped silicon. In another case, when the first silicon interconnection region 510a is formed of doped silicon, the second silicon interconnection region 510b may be formed of doped silicon having the same conductivity type as the first silicon interconnection region 510a and a higher dopant concentration than the first silicon interconnection region 510a. For instance, the first silicon interconnection region 510a may be formed of n-type doped silicon, while the second silicon interconnection region 510b may be formed of n-type doped silicon having a higher dopant concentration than the first silicon interconnection region 510a.

According to some example embodiments, the second interconnection 525b may further include a second metal buffer region 515b interposed between the second silicon interconnection region 510b and the second metal interconnection region 520b. The second metal buffer region 515b may include at least one of a metal nitride and a metal-semiconductor compound.

Meanwhile, the first interconnection 525a may further include a first metal buffer region 515a interposed between the first silicon interconnection region 510a and the first metal interconnection region 520a. The first metal buffer region 515a may include at least one of a metal nitride and a metal-semiconductor compound.

According to other example embodiments, a silicon buffer region 512a may be provided on the first silicon interconnection region 510a. The silicon buffer region 512a may have a lower resistivity than the first silicon interconnection region 510a.

The first interconnection 525a may be provided in a region more crowded with interconnections, while the second interconnection 525b may be provided in a region less crowded with interconnections. Thus, the loading capacitance of the first and second interconnections 525a and 525b may be improved. More specifically, as compared with the second interconnection 525b, the first interconnection 525a may be disposed adjacent to a larger number of other conductive structures, for example, a larger number of other interconnections or contact plugs. Also, as compared with the second interconnection 525b, the first interconnection 525a may be spaced a smaller distance apart from other adjacent conductive structures, for example, other adjacent interconnections or contact plugs. Thus, the first silicon interconnection region 510a may be provided to have a higher resistivity than the second silicon interconnection region 510b so that the loading capacitance of interconnections, especially, the loading capacitance of the first interconnection 525a, may be reduced. Accordingly, the signal transmission rate of the first interconnection 525a may be increased, thereby improving the overall performance of the semiconductor device including the first and second interconnections 525a and 525b.

The present inventive concept should not be limited to the above-described embodiments and may be embodied in different forms. Semiconductor devices and methods of fabricating the same according to other example embodiments will now be described with reference to FIGS. 2 and 3A through 19.

Figure 16A:
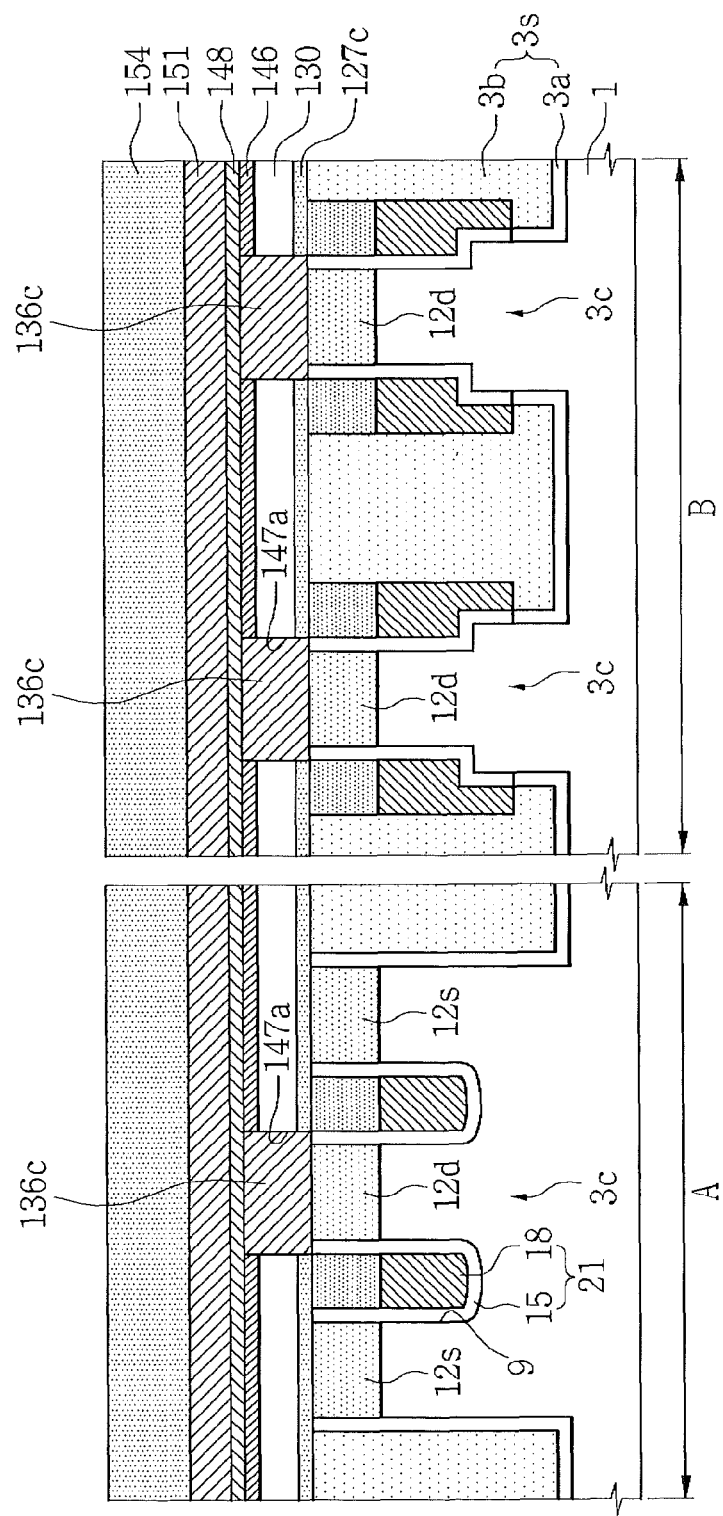
Figure 16B:
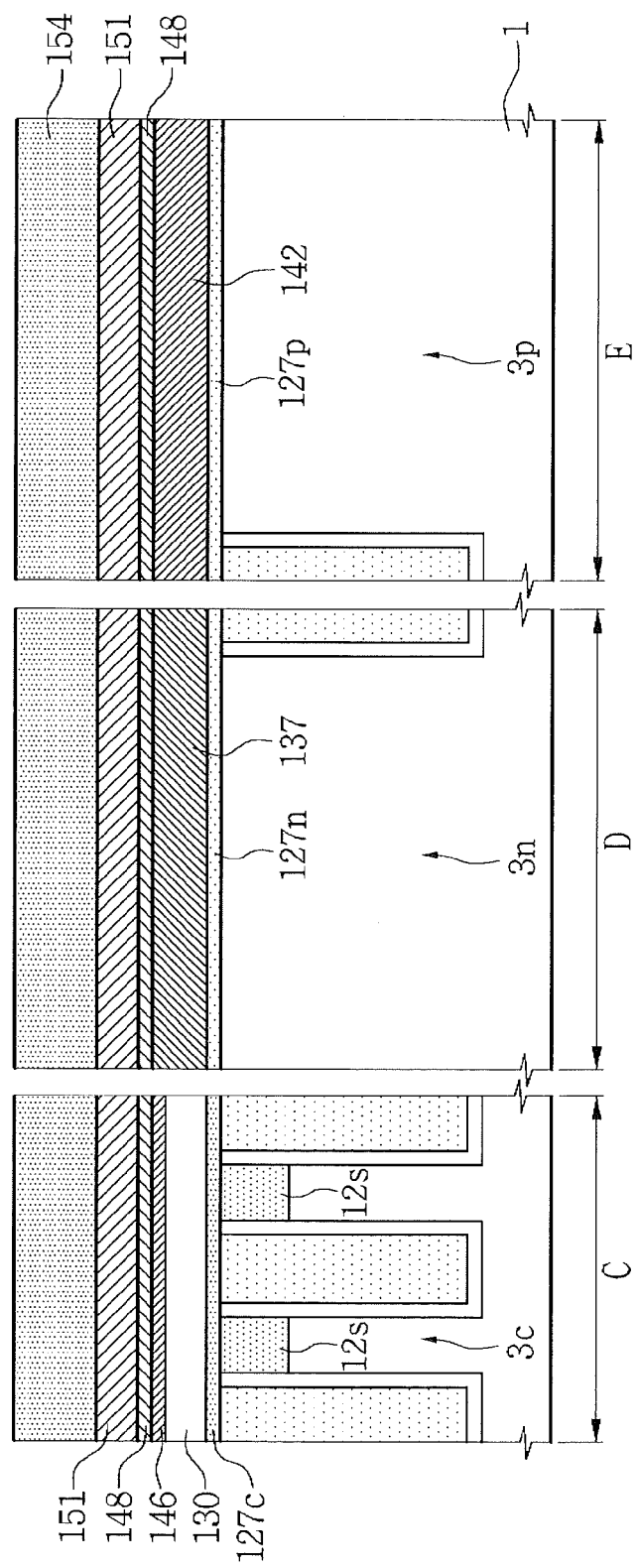
Figure 17A:
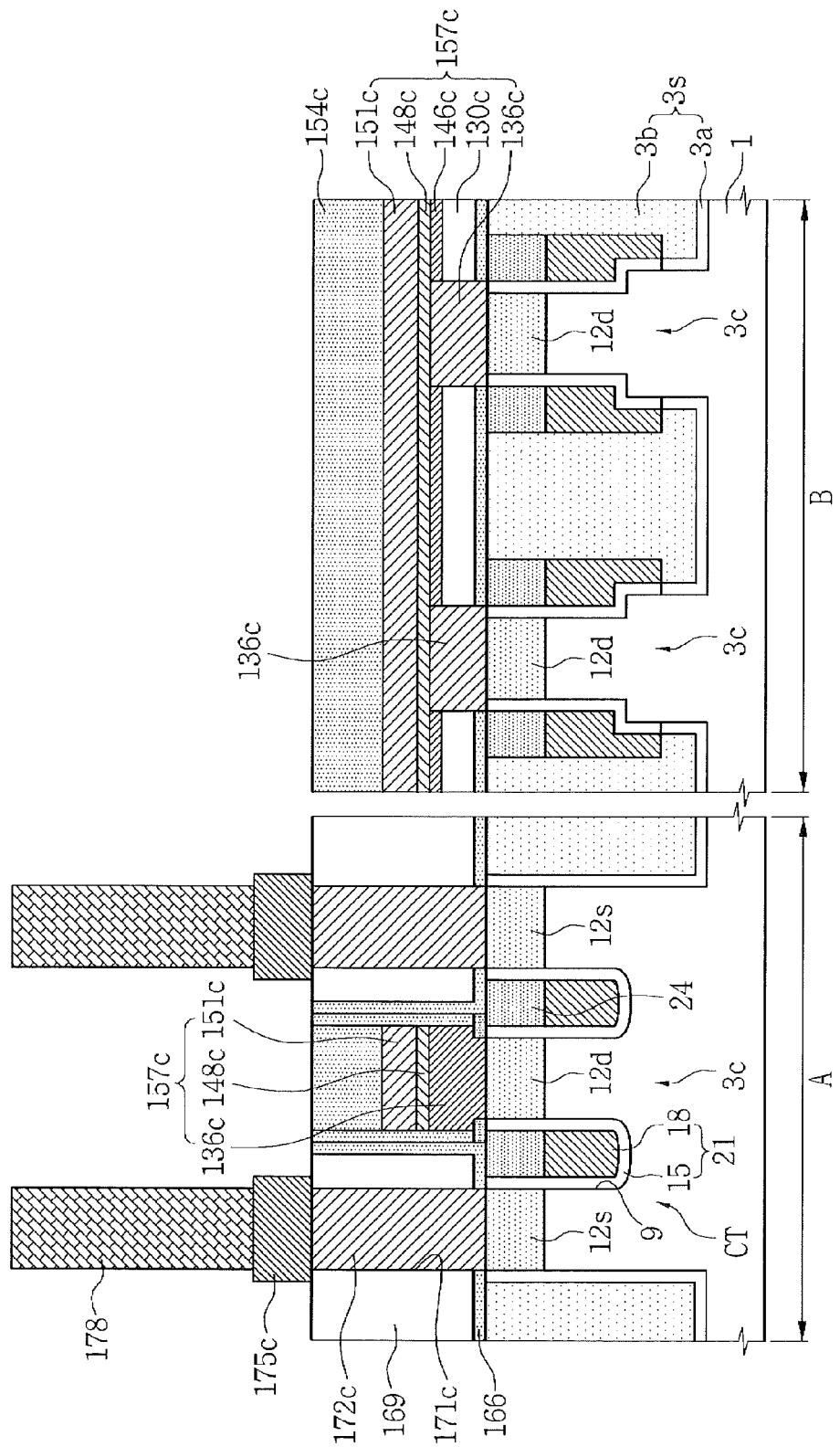
Figure 17B:
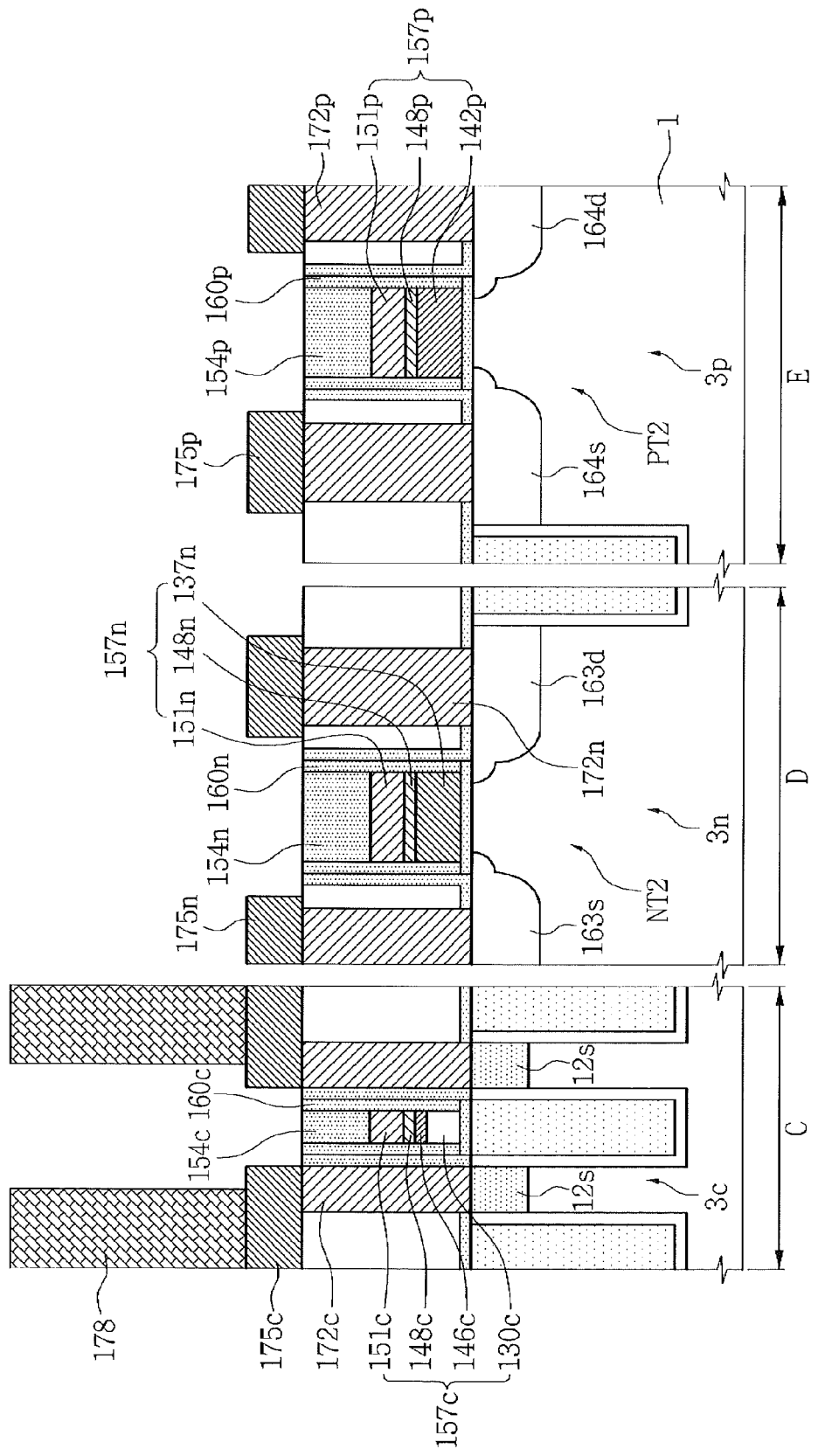
Figure 18:
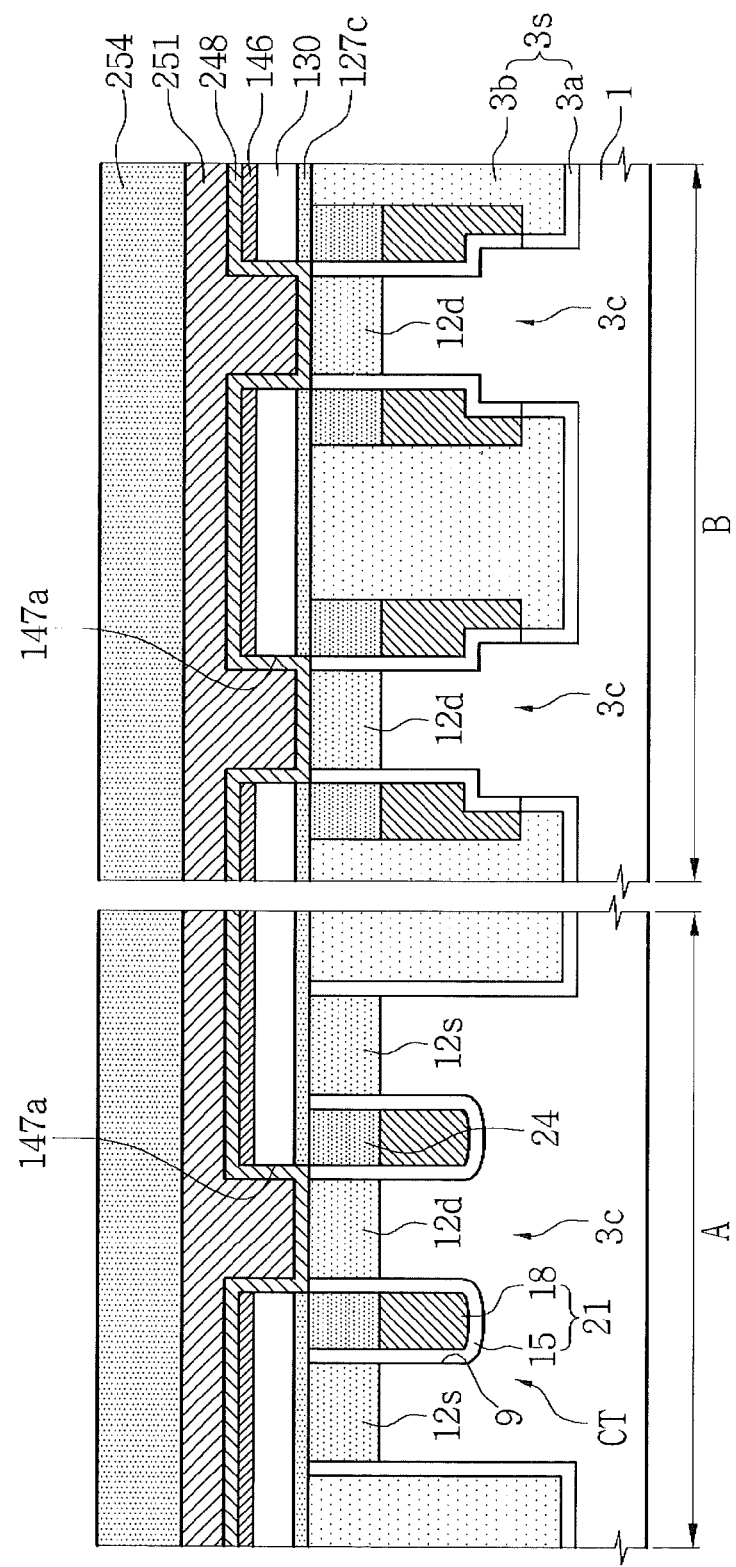
FIGS. 18 and 19 are cross-sectional views illustrating a method of fabricating a semiconductor device according to other example embodiments.
Figure 19:
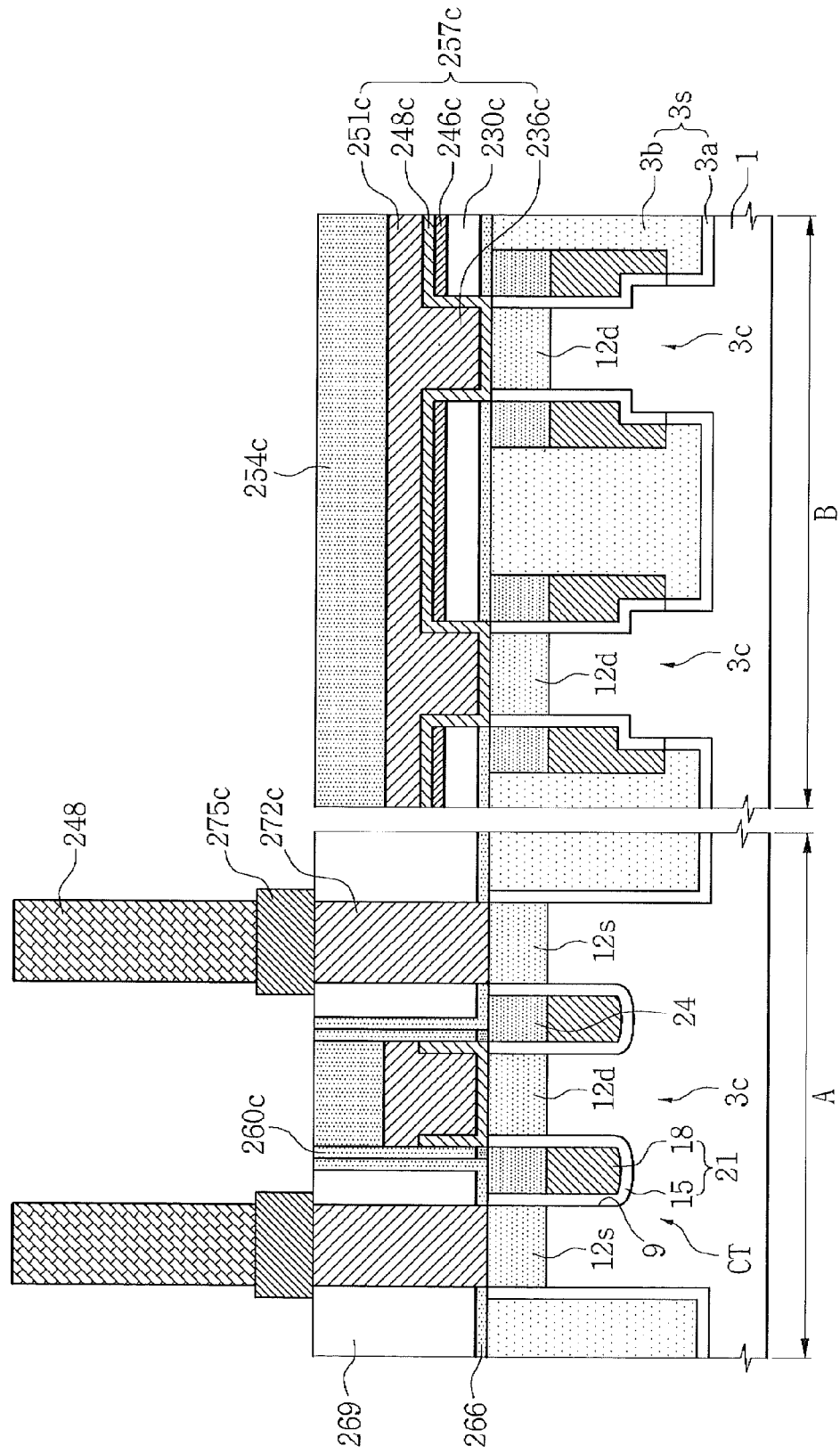

FIG. 2 is a plan view of a semiconductor device according to example embodiments, FIGS. 3A through 12B are cross-sectional views illustrating a method of fabricating a semiconductor device according to example embodiments, FIGS. 13A through 17B are cross-sectional views illustrating a method of fabricating a semiconductor device according to other example embodiments, and FIGS. 18 and 19 are cross-sectional views illustrating a method of fabricating a semiconductor device according to other example embodiments.

In FIG. 2, reference character M denotes a first circuit region, N denotes a second circuit region, and P denotes a third circuit region. In FIGS. 3A through 17B, 18, and 19, reference character A denotes a region taken along line I-I' of FIG. 2, B denotes a region taken along line II-II' of FIG. 2, C denotes a region taken along line III-III' of FIG. 2, D denotes a region taken along line IV-IV' of FIG. 2, and E denotes a region taken along line V-V' of FIG. 2. In FIGS. 3A through 19, reference characters A, B, and C each denote the first circuit region M, D denotes the second circuit region N, and E denotes the third circuit region P.

Figure 12A:
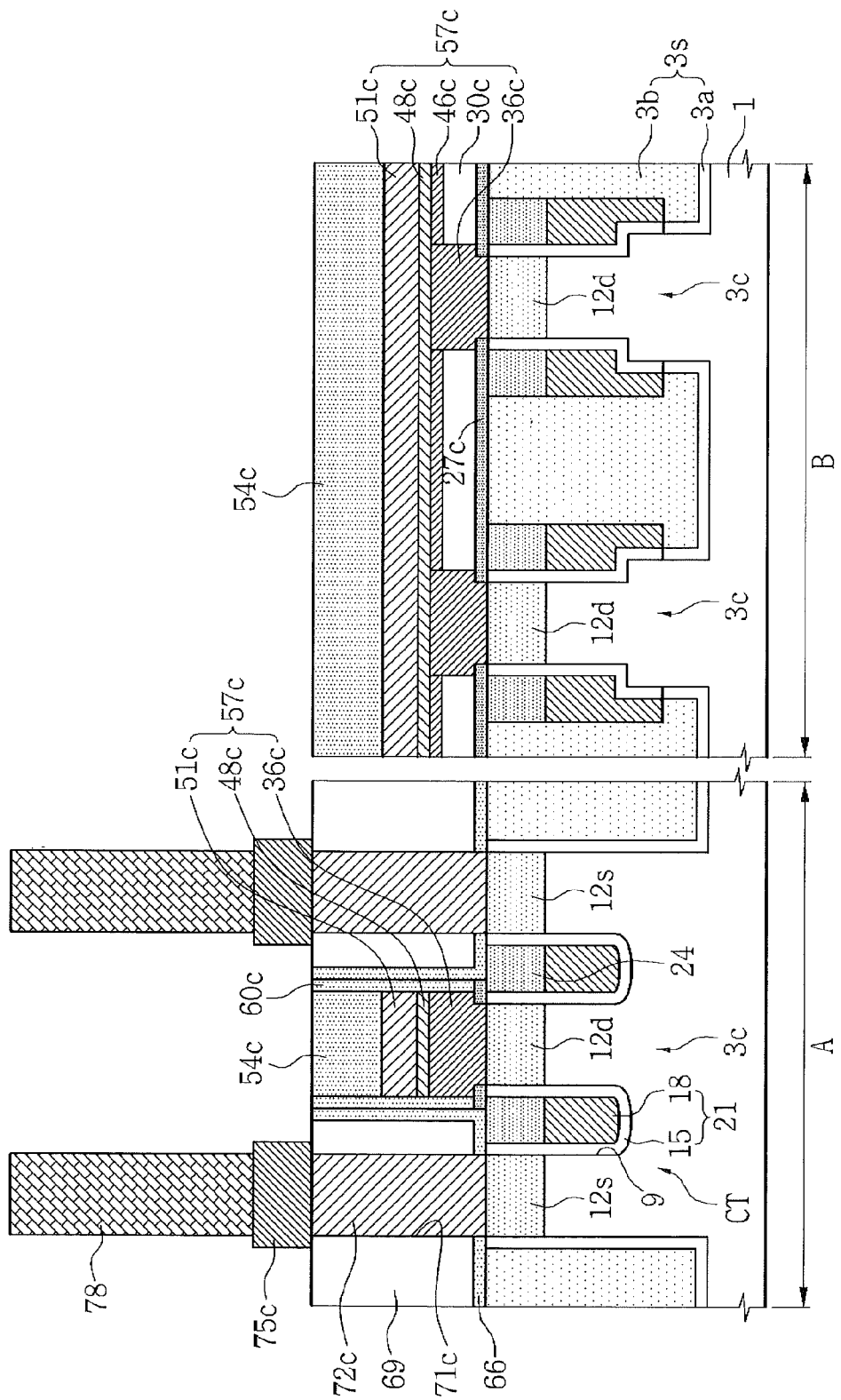
Figure 12B:
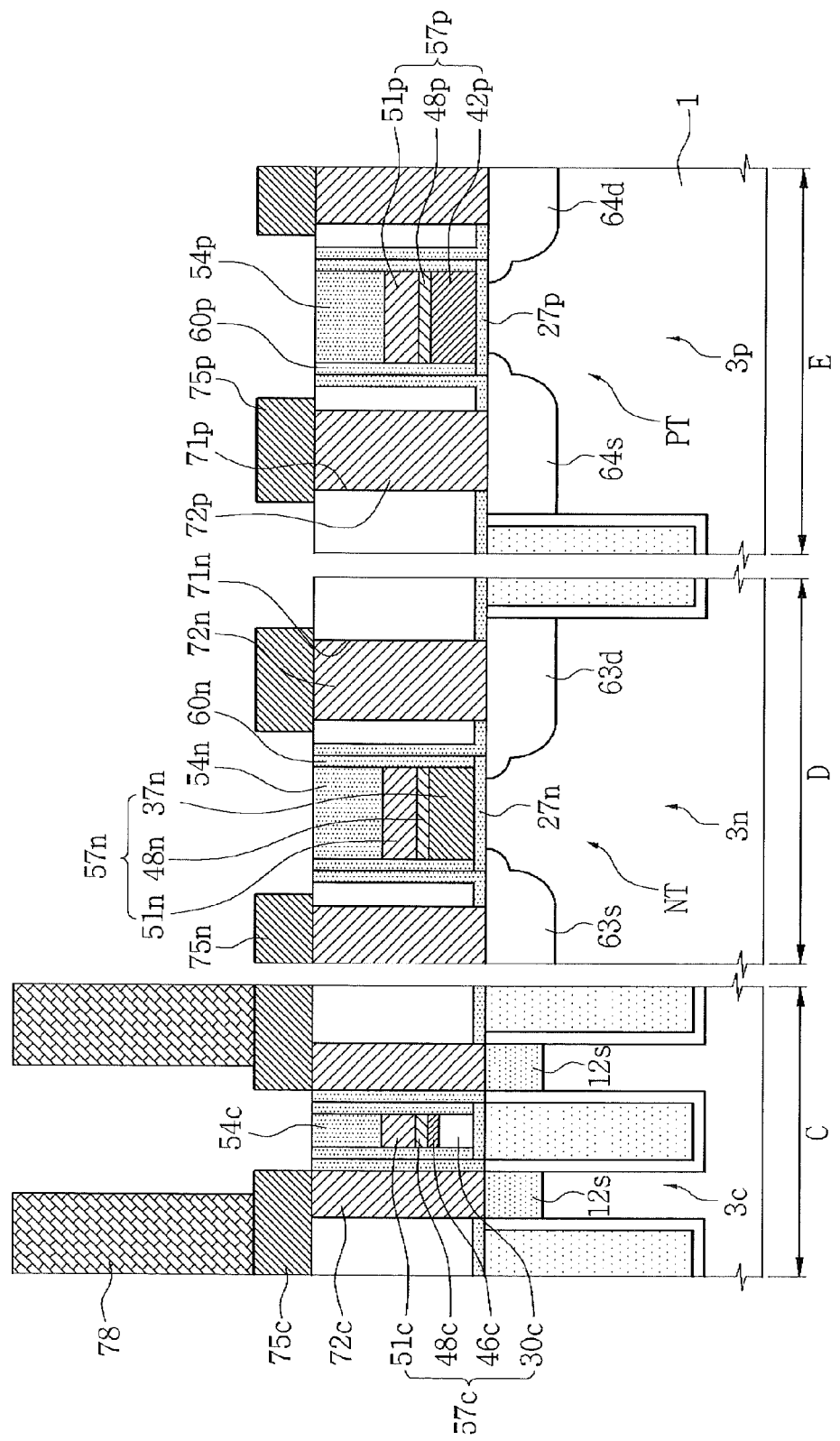

Referring to FIGS. 2, 12A, and 12B, a semiconductor substrate 1 having the first circuit region M, the second circuit region N, and the third circuit region P may be provided. The semiconductor substrate 1 may be a semiconductor wafer including a semiconductor material, such as silicon (Si). The first circuit region M may be a memory cell array region, the second circuit region N may be a peripheral circuit region including an NMOS transistor, and the third circuit region P may be a peripheral circuit region including a PMOS transistor. The first circuit region M may be more highly integrated than the second and third circuit regions N and P.

An isolation region 3s defining first through third active regions 3c, 3n, and 3p may be provided in the semiconductor substrate 1. More specifically, the isolation region 3s may define the first active region 3c, for example, a cell active region, in the first circuit region M, define the second active region 3n, for example, an NMOS active region, in the second circuit region N, and define the third active region 3p, for example, a PMOS active region, in the third circuit region P.

A gate trench 9 may run across the first active region 3c and extend to the isolation region 3s. A single or a plurality of gate trenches 9 may run across a single first active region 3c. For example, a pair of gate trenches 9, which are spaced apart from each other, may run across a single first active region 3c and extend to the isolation region 3s.

According to some example embodiments, a bottom region of a portion of the gate trench 9 that runs across the first active region 3c may be disposed at a higher level than a bottom region of a portion of the gate trench 9 that extends to the isolation region 3s.

According to other example embodiments, a bottom region of a portion of the gate trench 9 that runs across the first active region 3c may be disposed at substantially the same level with a bottom region of a portion of the gate trench 9 that extends to the isolation region 3s.

A first gate structure 21 may be provided in the gate trench 9. The first gate structure 21 may partially fill the gate trench 9 disposed across the first active region 3c and extend to the isolation region to cover sidewalls of the first active region 3c at a lower level than a bottom region of the gate trench 9 disposed in the first active region 3c.

The first gate structure 21 may include a first gate dielectric layer 15 and a first gate conductive pattern 18. The first gate dielectric layer 15 may be disposed on an inner wall of the gate trench 9. The first gate conductive pattern 18 may be disposed on the first gate dielectric layer 15 and partially fill the gate trench 9. In a memory device, such as a dynamic random access memory (DRAM), the first gate conductive pattern 18 may be defined as a word line. The first gate dielectric layer 15 may include at least one of a silicon oxide layer and a high-k dielectric layer having a higher dielectric constant than the silicon oxide layer. The first gate conductive pattern 18 may include at least one selected from the group consisting of a metal layer, a metal nitride layer, a metal silicide layer, and a doped polysilicon (poly-Si) layer. For example, the first gate dielectric layer 15 may be formed of a thermal oxide layer, and the first gate conductive pattern 18 may be formed of a titanium nitride layer.

The first gate conductive pattern 18 may partially fill the gate trench 9 at a lower level than a top surface of the first active region 3c. A portion of the first gate conductive pattern 18 that runs across the first active region 3c may be defined as a first gate electrode.

First source and drain regions 12s and 12d may be disposed in the first active region 3c on both sides of the first gate structure 2'. The first source and drain regions 12s and 12d, the first gate dielectric layer 15, and the first gate conductive pattern 18 may constitute a first MOS transistor CT.

A first gate capping pattern 24 may be disposed on the first gate structure 21. The first gate capping pattern 24 may fill the gate trench 9 along with the first gate structure 21. The first gate capping pattern 24 may include at least one selected from the group consisting of a silicon oxide layer, a silicon nitride layer, and a silicon oxynitride layer.

A first interconnection 57c may be disposed on the first circuit region M of the semiconductor substrate 1. In a memory device, such as a DRAM, the first interconnection 57c may be defined as a bit line. The first interconnection 57c may include a first silicon pattern 30c and 36c and a first metal pattern 51c that are stacked sequentially.

The first silicon pattern 30c and 36c may include contact regions 36c, which are spaced apart from each other, and a first silicon interconnection region 30c interposed between the contact regions 36c. Each of the contact regions 36c may overlap one region 12d of the first source and drain regions 12s and 12d. Each of the contact regions 36c may be electrically connected to one region 12d of the first source and drain regions 12s and 12d. The contact regions 36c may be formed of doped silicon. The first silicon interconnection region 30c may have a higher resistivity than the contact regions 36c.

According to some example embodiments, the first silicon interconnection region 30c may be formed of undoped silicon or intrinsic silicon.

According to other example embodiments, the first silicon interconnection region 30c may be formed of lightly doped silicon. In this case, the first silicon interconnection region 30c may be formed of doped silicon having the same conductivity type (e.g., n type) as the contact regions 36c and a lower dopant concentration than the contact regions 36c.

According to other example embodiments, a doped silicon buffer region 46c may be interposed between the first silicon interconnection region 30c and the first metal pattern 51c. The doped silicon buffer region 46c may have a lower resistivity than the first silicon interconnection region 30c. For example, the doped silicon buffer region 46c may be a heavily doped region, while the first silicon interconnection region 30c may be a lightly doped region.

According to other example embodiments, a metal buffer region 48c may be interposed between the first metal pattern 51c and the doped silicon buffer region 46c and between the first metal pattern 51c and the contact regions 36c. The metal buffer region 48c may include at least one of a metal nitride and a metal-semiconductor compound. For example, the metal buffer region 48c may be a stacked layer of a titanium nitride (TiN) layer and a tungsten silicide (WSi) layer.

A second gate structure 57n may be disposed on the second circuit region N of the semiconductor substrate 1 across the second active region 3n. The second gate structure 57n may have a line shape. In the present example embodiments, it may be inferred that the second gate structure 57n corresponds to the second interconnection 525b described with reference to FIG. 1.

The second gate structure 57n may include a second silicon pattern 37n and a second metal pattern 51n that are stacked sequentially. Furthermore, the second gate structure 57n may include a second metal buffer pattern 48n interposed between the second silicon pattern 37n and the second metal pattern 51n. A width L2 of the second silicon pattern 37n may be greater than a width L1 of the first silicon interconnection region 30c.

The second silicon pattern 37n may have a lower resistivity than the first silicon interconnection region 30c. For example, the first silicon interconnection region 30c may be formed of undoped silicon or intrinsic silicon, while the second silicon pattern 37n may be formed of doped silicon. Alternatively, the first silicon interconnection region 30c may be formed of doped silicon of a first conductivity type, while the second silicon pattern 37n may be formed of doped silicon of the same first conductivity type as the first silicon interconnection region 30c and a lower resistivity than the first silicon interconnection region 30c. For instance, when the first silicon interconnection region 30c is formed of doped silicon having a first dopant concentration, the second silicon pattern 37n may be formed of doped silicon having a second dopant concentration higher than the first dopant concentration.

A third gate structure 57p may be disposed on the third circuit region P of the semiconductor substrate 1 across the third active region 3p. The third gate structure 57p may have a line shape.

The third gate structure 57p may include a third silicon pattern 42p and a third metal pattern 51p that are stacked sequentially. Furthermore, the third gate structure 57p may include a third metal buffer pattern 48p interposed between the third silicon pattern 42p and the third metal pattern 51p. A width L3 of the third silicon pattern 42p may be greater than the width L1 of the first silicon interconnection region 30c.

The third silicon pattern 42p may have a different conductivity type from the second silicon pattern 42n. For example, when the second silicon pattern 37n is formed of n-type doped silicon, the third silicon pattern 42p may be formed of p-type doped silicon. The first through third metal patterns 51c, 51n, and 51p may be formed of the same material.

The first interconnection 57c, the second gate structure 57n, and the third gate structure 57p may be disposed at substantially the same level.

First through third capping masks 54c, 54n, and 54p may be provided on the first through third metal patterns 51c, 51n, and 51p. The first through third capping masks 54c, 54n, and 54p may include an insulating material layer, such as a silicon nitride layer.

Second source and drain regions 63s and 63d may be disposed in the second active region 3n on both sides of the second gate structure 57n. A second gate dielectric layer 27n may be disposed between the second gate structure 57n and the second active region 3n. Thus, a second MOS transistor NT including the second gate dielectric layer 27n, the second gate structure 57n, and the second source and drain regions 63s and 63n may be disposed on the second circuit region N. The second MOS transistor NT may be an NMOS transistor.

Third source and drain regions 64s and 64d may be disposed in the third active region 3p on both sides of the third gate structure 57p. Also, a third gate dielectric layer 27p may be interposed between the third gate structure 57p and the third active region 3p. Thus, a third MOS transistor PT including the third gate dielectric layer 27p, the third gate structure 57p, and the third source and drain regions 64s and 64d may be disposed on the third circuit region P. The third MOS transistor PT may be a PMOS transistor.

An interlayer insulating layer 69 may be disposed on the semiconductor substrate 1 having the second and third MOS transistors NT and PT. The interlayer insulating layer 69 may include a silicon oxide layer and/or a low-k dielectric layer having a lower dielectric constant than the silicon oxide layer.

A first contact structure 72c may be disposed through the interlayer insulating layer 69 on the first circuit region M. The first contact structure 72c may be electrically connected to one of the first source and drain regions 12s and 12d, which is not connected to the first interconnection 57c. The first contact structure 72c may include at least one of a doped poly-Si layer and a metal layer.

A second contact structure 72n may be disposed through the interlayer insulating layer 69 on the second circuit region N. The second contact structure 72n may be electrically connected to at least one of the second source and drain regions 63s and 63d.

A third contact structure 72p may be disposed through the interlayer insulating layer 69 on the third circuit region P. The third contact structure 72p may be electrically connected to at least one of the third source and drain regions 64s and 64d. The first through third contact structures 72c, 72n, and 72p may be formed of the same material.

A conductive buffer pattern 75c may be disposed on the first contact structure 72c. A first conductive pattern 75n may be disposed on the second contact structure 72n, while a second conductive pattern 75p may be disposed on the third contact structure 72p. The first and second conductive patterns 75n and 75p may include at least one of a doped poly-Si layer and a metal layer.

A data storage element 78 may be disposed on the buffer pattern 75c. The data storage element 78 may be a data storage unit of a volatile memory device or nonvolatile memory device. For example, the data storage element 78 may be a capacitor of a DRAM, which may include a lower electrode, a dielectric material, and an upper electrode.

In the present embodiments, as compared with the second and third gate structures 57n and 57p, the first interconnection 57c may be adjacent to a larger number of other conductive structures (i.e., first contact structures 72c). Thus, the first silicon interconnection region 30c of the first interconnection 57c may be formed of undoped silicon or intrinsic silicon so that the loading capacitance of the first interconnection 57c, which occurs due to the first contact structures 72c, can be reduced. Also, in the second and third gate structures 57n and 57p, since the second and third silicon patterns 37n and 42p, which may be respectively defined as second and third silicon interconnection regions, may be formed of heavily doped silicon, the resistance characteristics of the second and third gate structures 57n and 57p may be improved. As a result, the overall performance of the semiconductor device may be enhanced.

The present inventive concept is not limited to the above-described embodiments and may be embodied in different forms. For example, it is described above with reference to FIGS. 12A and 12B that the first interconnection 57c may include the contact regions 36c formed of doped silicon. However, the present inventive concept is not limited thereto, and the contact regions 36c may be formed of other materials than doped silicon, for example, a metal. That is, the first interconnection 57c of FIGS. 12A and 12B may be embodied in the same form as a first interconnection 257c of FIG. 19. Hereinafter, the first interconnection 257c having a modified form of the first interconnection 57c of FIGS. 12A and 12B will be described with reference to FIG. 19.

Referring to FIG. 19, a semiconductor substrate 1 having the same first MOS transistor CT as described with reference to FIGS. 12A and 12B may be provided. The first interconnection 257c may be disposed on the semiconductor substrate 1. The first interconnection 257c may include contact regions 236c, a first silicon interconnection region 230c interposed between the contact regions 236c, and a first metal pattern 251c disposed on the contact regions 236c and the first silicon interconnection region 230c. Here, the contact regions 236c and the first metal pattern 251c may be formed of the same material. Also, the contact regions 236c may extend from the first metal pattern 251c. Thus, the contact regions 36c of FIG. 12A may be formed of doped silicon, while the contact regions 236c of FIG. 19 may be formed of the same material as the first metal pattern 251c, for example, a metal such as W. The first metal pattern 251c disposed over the first silicon interconnection region 230c may be defined as a first metal interconnection region, and the contact regions 236c may be defined as metal contact regions.

According to some example embodiments, a first metal buffer pattern 248c may be interposed between the first metal pattern 251c and the first silicon interconnection region 230c and between the contact regions 236c and the first silicon interconnection region 230c. Also, the first metal buffer pattern 248c may be disposed under a bottom region of the contact regions 236c. The first metal buffer pattern 248c may include at least one of a metal nitride and a metal-semiconductor compound. Furthermore, in order to reduce a contact resistance between one region 12d of the first source and drain regions 12s and 12d and the contact regions 236c, a heavily doped plug ion implantation region may be disposed in an upper region of the region 12d of the first source and drain regions 12s and 12d. The heavily doped plug ion implantation region may be formed by further implanting impurity ions of the same conductivity type as the first source and drain regions 12s and 12d into the upper region of the region 12d.

According to other example embodiments, a silicon buffer region 246c may be disposed on the first silicon interconnection region 230c. The silicon buffer region 246c may have a lower resistivity than the first silicon interconnection region 230c.

Hereinafter, methods of fabricating semiconductor devices according to example embodiments will be described.

Initially, a method of fabricating a semiconductor device according to example embodiments will now be described with reference to FIGS. 2 and 3A through 12B.

Figure 3B:
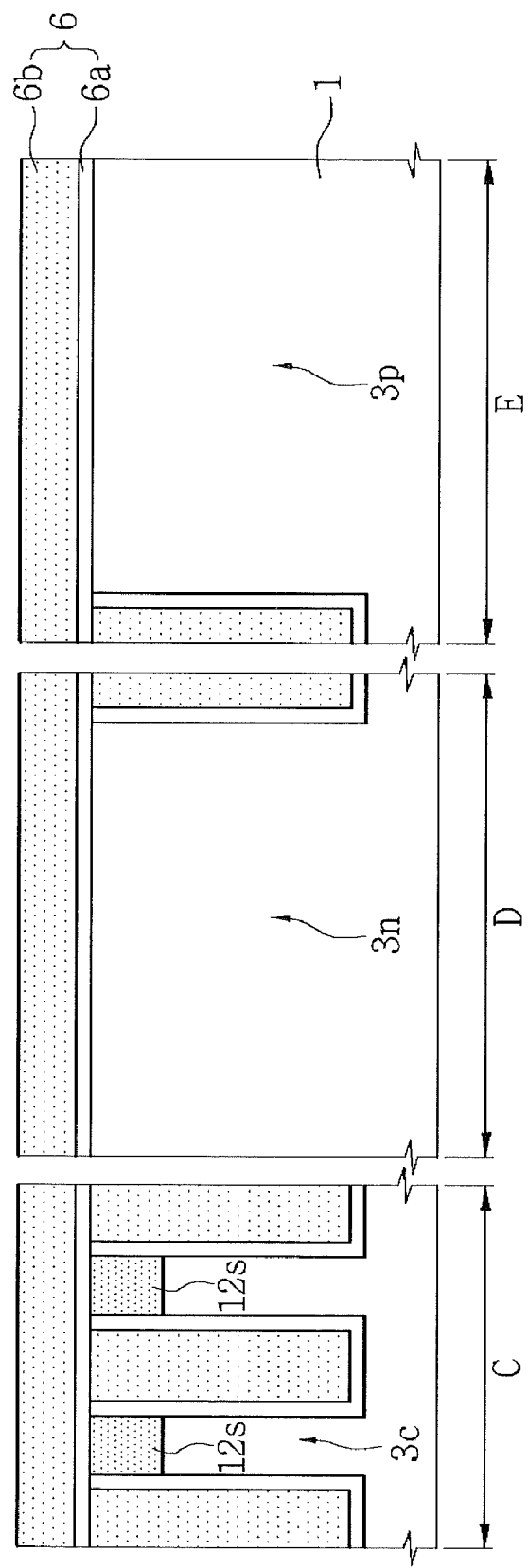

Referring to FIGS. 2, 3A, and 3B, a semiconductor substrate 1 having a first circuit region M, a second circuit region N, and a third circuit region P may be prepared. The semiconductor substrate 1 may be a semiconductor wafer including a semiconductor material, such as silicon (Si). The first circuit region M may be a memory cell array region, the second circuit region N may be a circuit region including an NMOS transistor, and the third circuit region P may be a circuit region including a PMOS transistor. The first circuit region M may be more highly integrated than the second and third circuit regions N and P.

An isolation region 3s defining active regions 3c, 3n, and 3p may be formed in the semiconductor substrate 1. More specifically, the isolation region 3s may define a first active region, for example, a cell active region 3c, in the first circuit region M, define a second active region, for example, an NMOS active region 3n, in the second circuit region N, and define a third active region, for example, a PMOS active region 3p, in the third circuit region P.

The isolation region 3s may be formed using a shallow trench isolation (STI) process. For example, the formation of the isolation region 3s may include forming an isolation trench in the semiconductor substrate 1, forming a buffer layer 3a on an inner wall of the isolation trench, and forming an isolation layer 3b on the buffer layer 3a to fill the isolation trench. The buffer layer 3a may be formed to include at least one of a thermal oxide layer and an insulating liner. The insulating liner may be formed of a silicon nitride layer. The isolation layer 3b may be formed of an insulating material, such as silicon oxide.

According to some example embodiments, a preliminary impurity region of a different conductivity type from the first active region 3c may be formed in the first active region 3c. For example, when the first active region 3c is a p type, impurity ions may be implanted into the first active region 3c, thereby forming an n-type preliminary impurity region (not shown) in an upper region of the first active region 3c.

A gate mask 6 having an opening 7 may be formed on the semiconductor substrate 1 having the isolation region 3s. The opening 7 may run across the first active region 3c and extend to the isolation region 3s disposed adjacent to the first active region 3c. The gate mask 6 may include a buffer oxide layer 6a and a hard mask 6b that are stacked sequentially. The hard mask 6b may include a material having an etch selectivity with respect to the isolation region 3s and the semiconductor substrate 1. For example, the hard mask 6b may include at least one selected from the group consisting of a silicon nitride layer, a poly-Si layer, and an amorphous carbon layer.

The first active region 3c and the isolation region 3s, which are exposed by the opening 7, may be etched to form a gate trench 9. The gate trench 9 may be formed across the first active region 3c having the preliminary impurity region (not shown). Thus, the preliminary impurity region may be divided by the gate trench 9 into first source and drain regions 12s and 12d spaced apart from each other.

Meanwhile, a single or a plurality of gate trenches 9 may be formed across a single first active region 3c. For example, a single preliminary impurity region formed in the first active region 3c may be divided by a pair of gate trenches 9 into three regions 12s and 12d.

The gate trench 9 may include a gate active trench 9a and a gate field trench 9b. The gate active trench 9a may be formed across the first active region 3c, and the gate field trench 9b may extend from the gate active trench 9b and be formed within the isolation region 3s.

According to some example embodiments, the gate field trench 9b may expose sidewalls of the active region 3c disposed under the gate active trench 9a. Thus, a bottom region of the gate field trench 9b may be disposed at a lower level than a bottom region of the gate active trench 9a.

According to other example embodiments, the bottom regions of the gate field trench 9b and the gate active trench 9a may be disposed at substantially the same level.

Figure 4A:
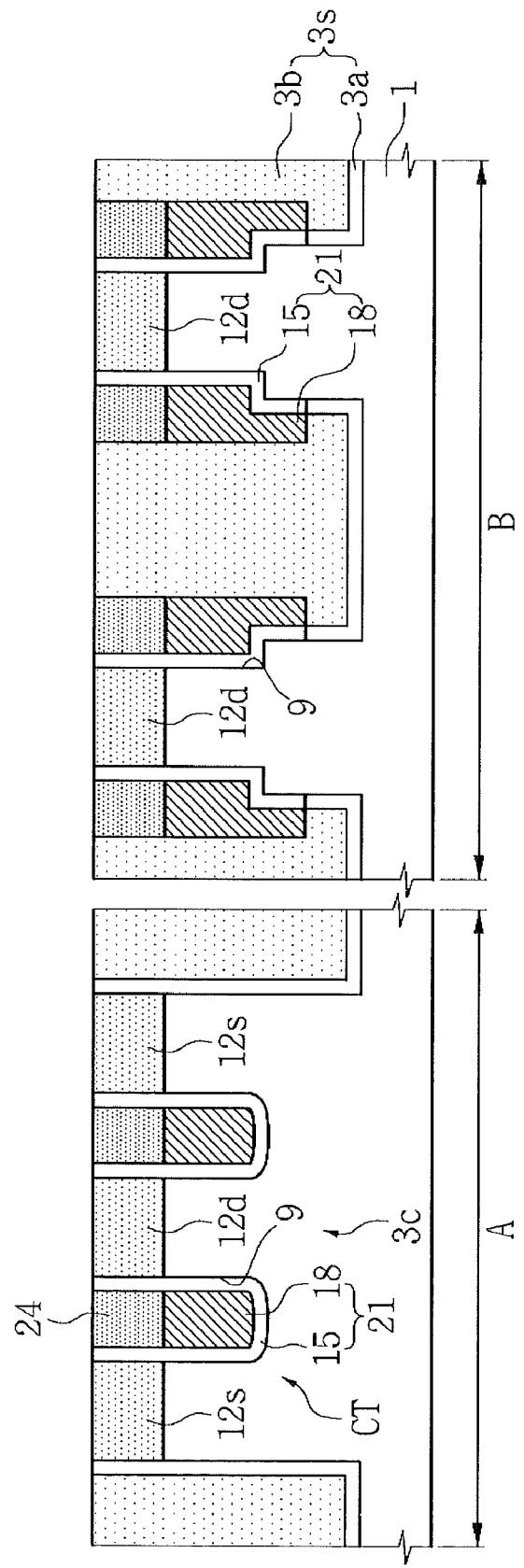
Figure 4B:
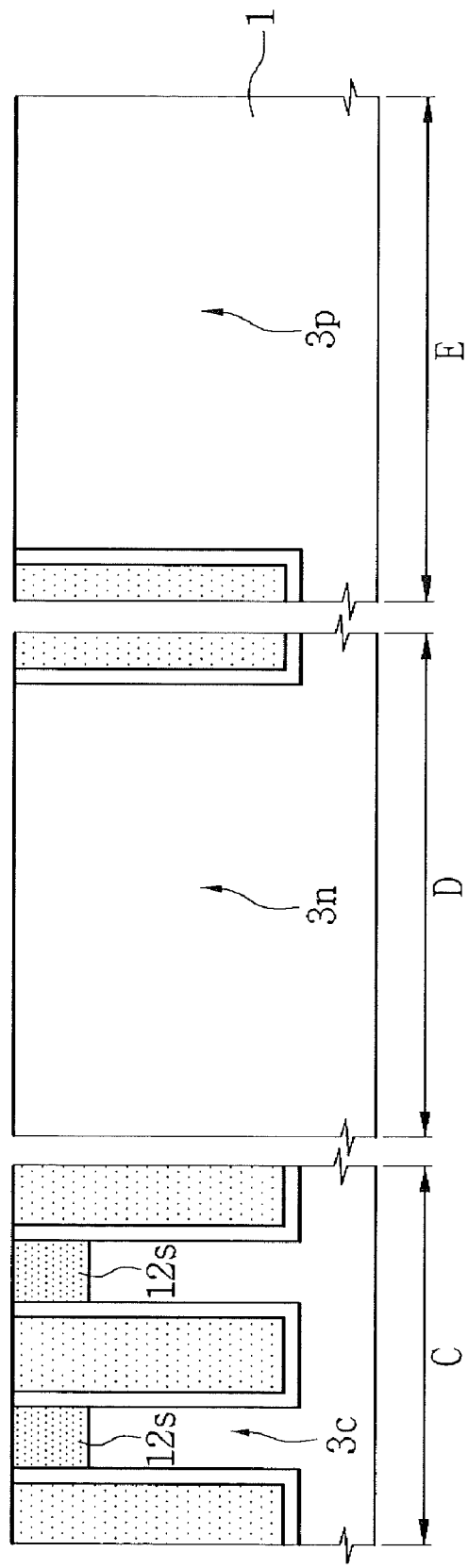

Referring to FIGS. 2, 4A, and 4B, a first gate structure 21 may be formed in the gate trench 9. The first gate structure 21 may include a first gate dielectric layer 15 and a first gate conductive pattern 18. The first gate dielectric layer 15 may be formed on the first active region 3c exposed by the gate trench 9. The first gate conductive pattern 18 may be formed on the first gate dielectric layer 15 and partially fill the gate trench 9. In a memory device, such as a DRAM, the first gate conductive pattern 18 may be defined as a word line.

The first gate dielectric layer 15 may be formed to include at least one of a silicon oxide layer and a high-k dielectric layer. The first gate dielectric layer 15 may be formed of a thermal oxide layer or a high-k dielectric layer having a higher dielectric constant than the silicon oxide layer. Meanwhile, when the first gate dielectric layer 15 is a high-k dielectric layer formed using a deposition process, such as an atomic layer deposition (ALD) process or a chemical vapor deposition (CVD) process, the first gate dielectric layer 15 may be formed not only on the surface of the first active region 3c exposed by the gate trench 9 but also on the surface of the isolation region 3s exposed by the gate trench 9. That is, the first gate dielectric layer 15 may be formed on an inner wall of the gate trench 9 to a substantially uniform thickness.

The first gate conductive pattern 18 may partially fill the gate trench 9 at a lower level than a top surface of the first active region 3c. A portion of the first gate conductive pattern 18 which runs across the first active region 3c may be defined as a first gate electrode. The first gate conductive pattern 18 may be formed of at least one selected from the group consisting of a metal layer, a metal nitride layer, a metal silicide layer, and a doped poly-Si layer.

The first source and drain regions 12s and 12d, the first gate dielectric layer 15, and the first gate conductive pattern 18 may constitute first MOS transistors CT.

A first gate capping pattern 24 may be formed to fill the remaining portion of the gate trench 9. The first gate capping pattern 24 may be formed to include at least one of a silicon oxide layer, a silicon nitride layer, and a silicon oxynitride layer.

The gate mask 6 may be removed. The removal of the gate mask 6 may be performed after forming the first gate capping pattern 24. Alternatively, the removal of the gate mask 6 may be performed before forming the first gate structure 21.

According to some example embodiments, the process of forming the preliminary impurity region (not shown) as described with reference to FIGS. 3A and 3B may be omitted, and the formation of the first gate capping pattern 24 may be followed by implanting impurity ions into the first active region 3c to form the first source and drain regions 12s and 12d.

Figure 5A:
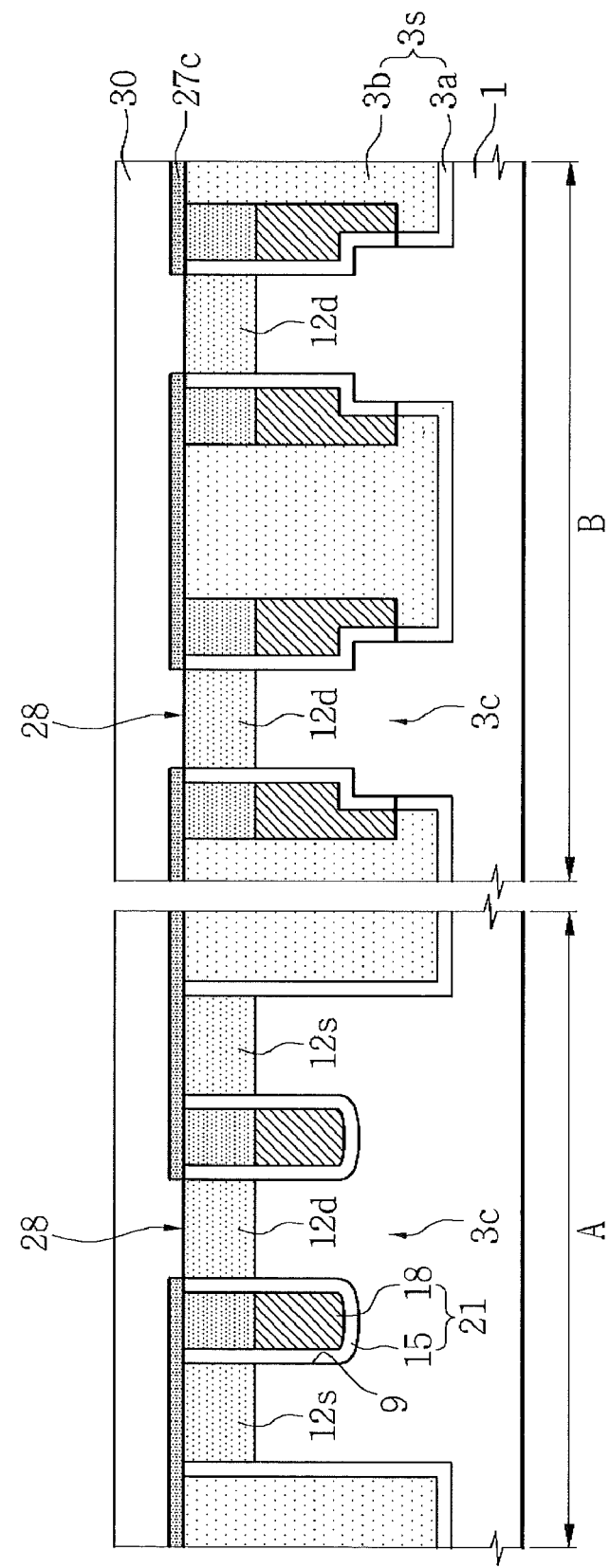
Figure 5B:
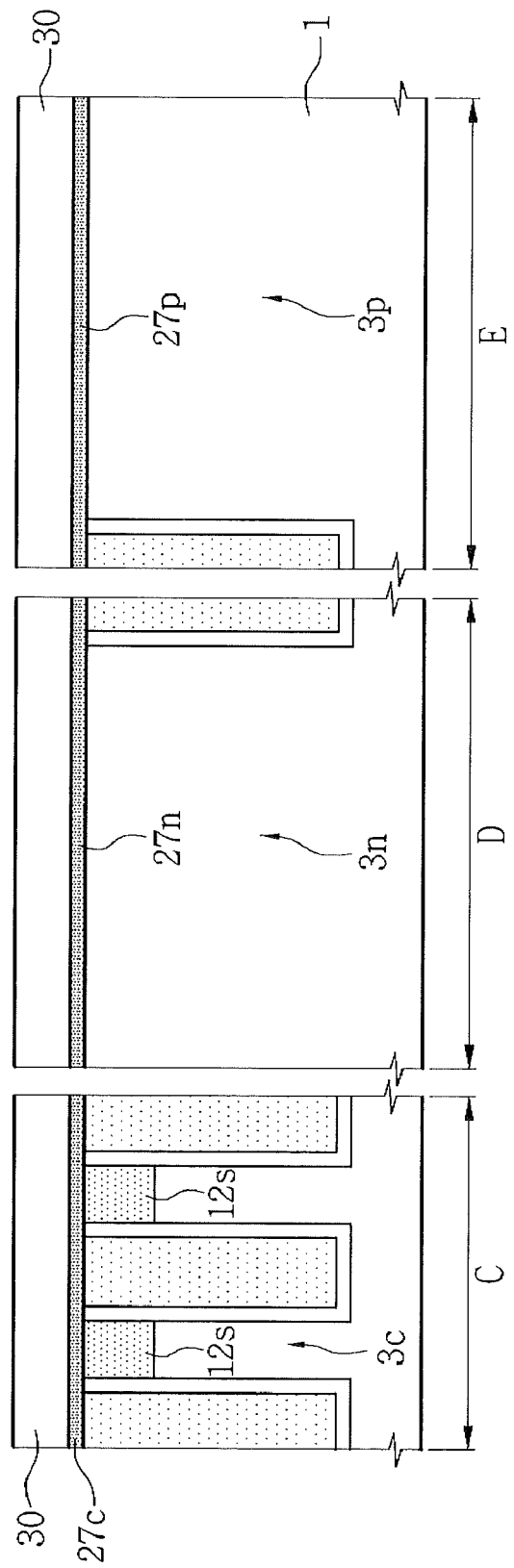

Referring to FIGS. 2, 5A, and 5B, a second gate dielectric layer 27n may be formed on the second active region 3n of the second circuit region N. The second gate dielectric layer 27n may be formed to include at least one of a silicon oxide layer and a high-k dielectric layer. A third gate dielectric layer 27p may be formed on the third active region 3p of the third circuit region P. The third gate dielectric layer 27p may be formed to include at least one of a silicon oxide layer and a high-k dielectric layer.

According to some example embodiments, the second and third gate dielectric layers 27n and 27p may be formed simultaneously. As a result, the second and third gate dielectric layers 27n and 27p may be formed of the same material to the same thickness.

According to other example embodiments, the second and third gate dielectric layers 27n and 27p may be formed to different thicknesses. For example, when the second circuit region N is a low-voltage circuit region, the second gate dielectric layer 27n may be formed to a first thickness, while when the third circuit region P is a high-voltage circuit region, the third gate dielectric layer 27p may be formed to a second thickness greater than the first thickness.

Meanwhile, while forming the second and third gate dielectric layers 27n and 27p, a buffer insulating layer 27c may be formed on the exposed surface of the first active region 3c of the first circuit region M. Thus, the buffer insulating layer 27c may be formed of the same material as at least one of the second and third gate dielectric layers 27n and 27p. Alternatively, before forming the second and third gate dielectric layers 27n and 27p, a buffer insulating layer 27c may be formed on the first circuit region M of the semiconductor substrate 1. In this case, the buffer insulating layer 27c may be formed to include at least one of a silicon oxide layer, a silicon oxynitride (SiON) layer, and a silicon nitride layer.

The buffer insulating layer 27c may be patterned, thereby forming an opening 28 exposing one region 12d of the first source and drain regions 12s and 12d.

A first silicon layer 30 having a first resistivity may be formed on the entire surface of the semiconductor substrate 1 having the second and third gate dielectric layers 27n and 27p. A poly-Si layer may be formed on the first silicon layer 30.

According to some example embodiments, the first silicon layer 30 may be formed of undoped silicon or intrinsic silicon.

According to other example embodiments, the first silicon layer 30 may be formed of doped silicon of a first conductivity type.

Figure 6A:
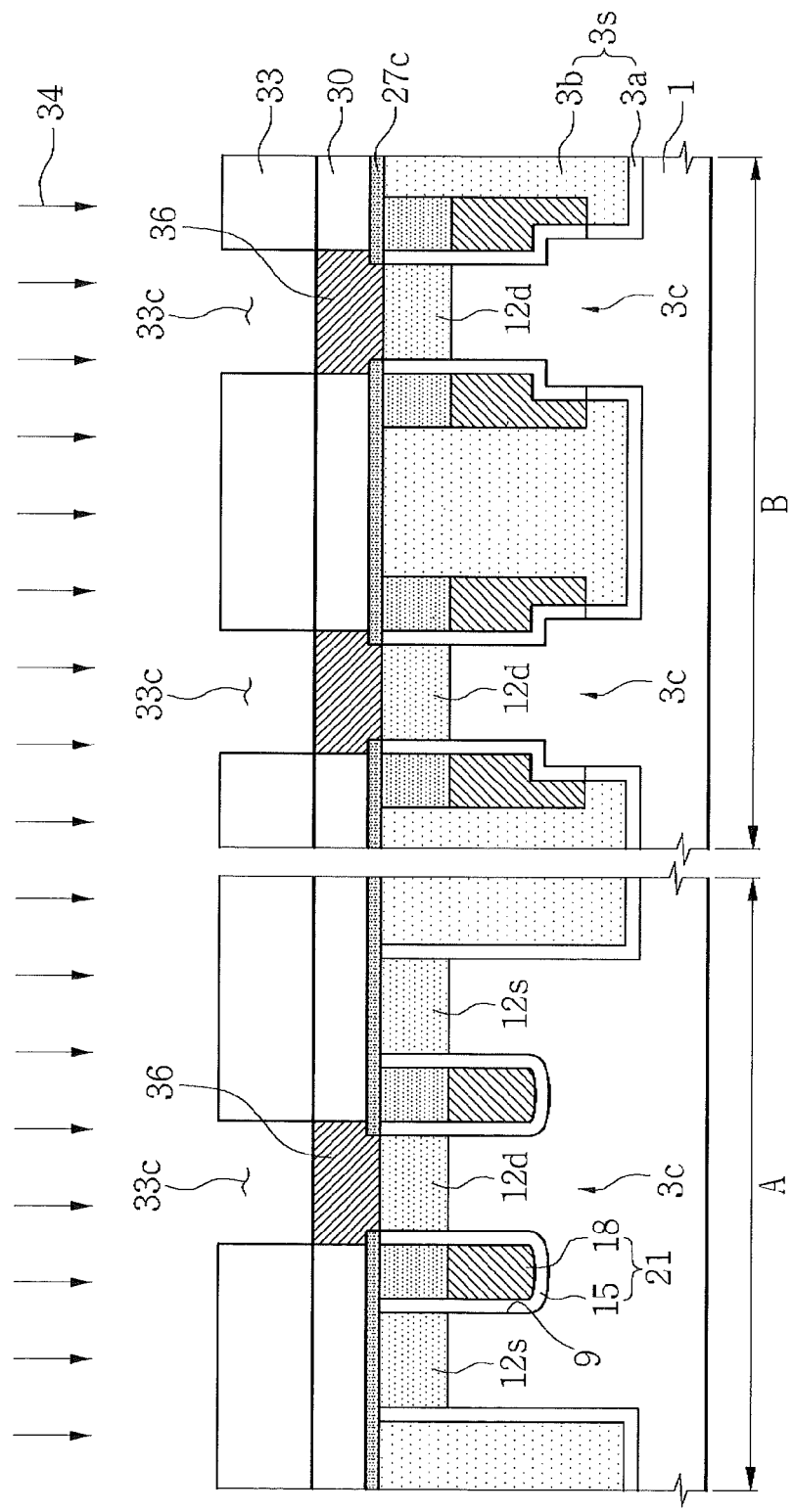
Figure 6B:
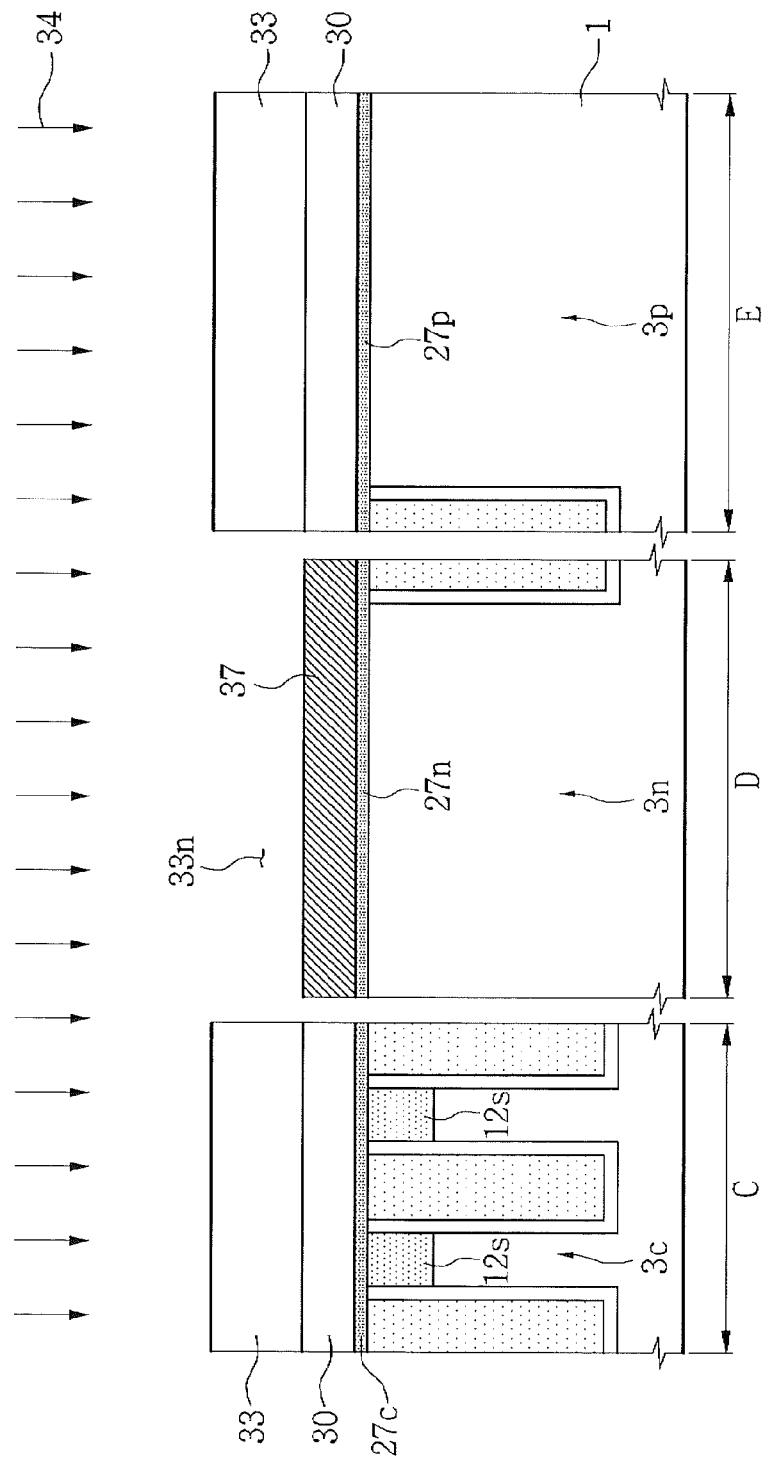

Referring to FIGS. 2, 6A, and 6B, a first ion implantation mask 33 having first and second openings 33c and 33n may be formed on the first silicon layer 30. The first ion implantation mask 33 may be formed to be a photoresist pattern.

The first opening 33c may overlap the region 12d of the first source and drain regions 12s and 12d formed in the first circuit region M. That is, the first silicon layer 30 disposed on the region 12d of the first source and drain regions 12s and 12d may be exposed by the first opening 33c. The second opening 33n may expose the first silicon layer 30 formed on the second circuit region N.

A first ion implantation process 34 may be performed to implant first impurity ions into a predetermined region of the first silicon layer 30. Thus, a first silicon region 36 may be formed in the first silicon layer 30 exposed by the first opening 33c of the first ion implantation mask 33, and a second silicon region 37 may be formed in the first silicon layer 30 exposed by the second opening 33n thereof.

Figure 7A:
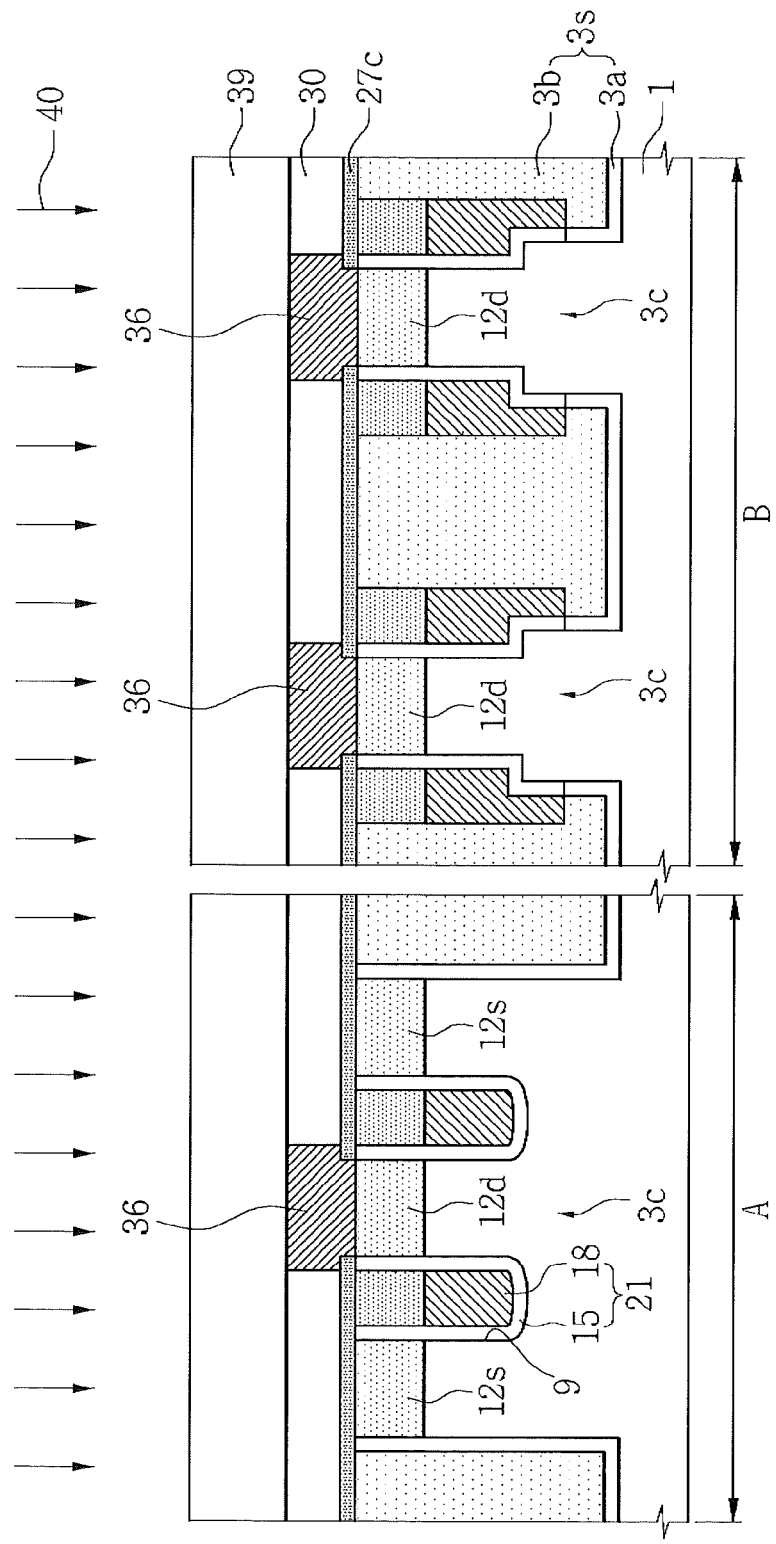
Figure 7B:
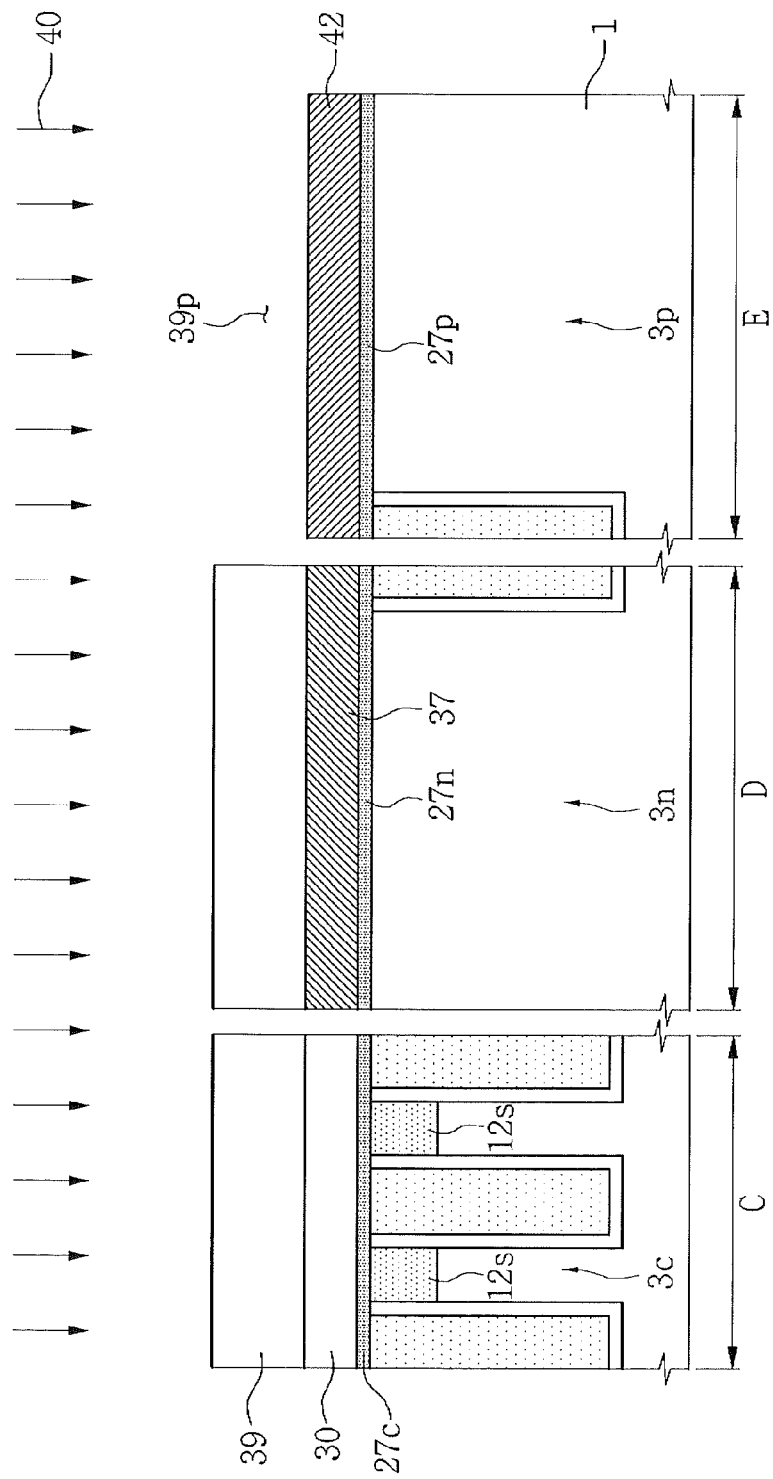

Referring to FIGS. 2, 7A, and 7B, the first ion implantation mask 33 of FIGS. 6A and 6B may be removed. A second ion implantation mask 39 may be formed on the semiconductor substrate 1 from which the first ion implantation mask 33 is removed. The second ion implantation mask 39 may be formed to have a third opening 39p exposing the first silicon layer 30 disposed on the third circuit region P. The second ion implantation mask 39 may be formed to be a photoresist pattern.

A second ion implantation process 40 may be performed to implant second impurity ions into the first silicon layer 30 exposed by the third opening 39p. Thus, a third silicon region 42 may be formed in the first silicon layer 30 exposed by the third opening 39p. The third silicon region 42 may be doped with different impurity ions from the second silicon region 37. For example, the second silicon region 37 may be doped with a Group V element, while the third silicon region 42 may be doped with a Group III element.

Figure 8A:
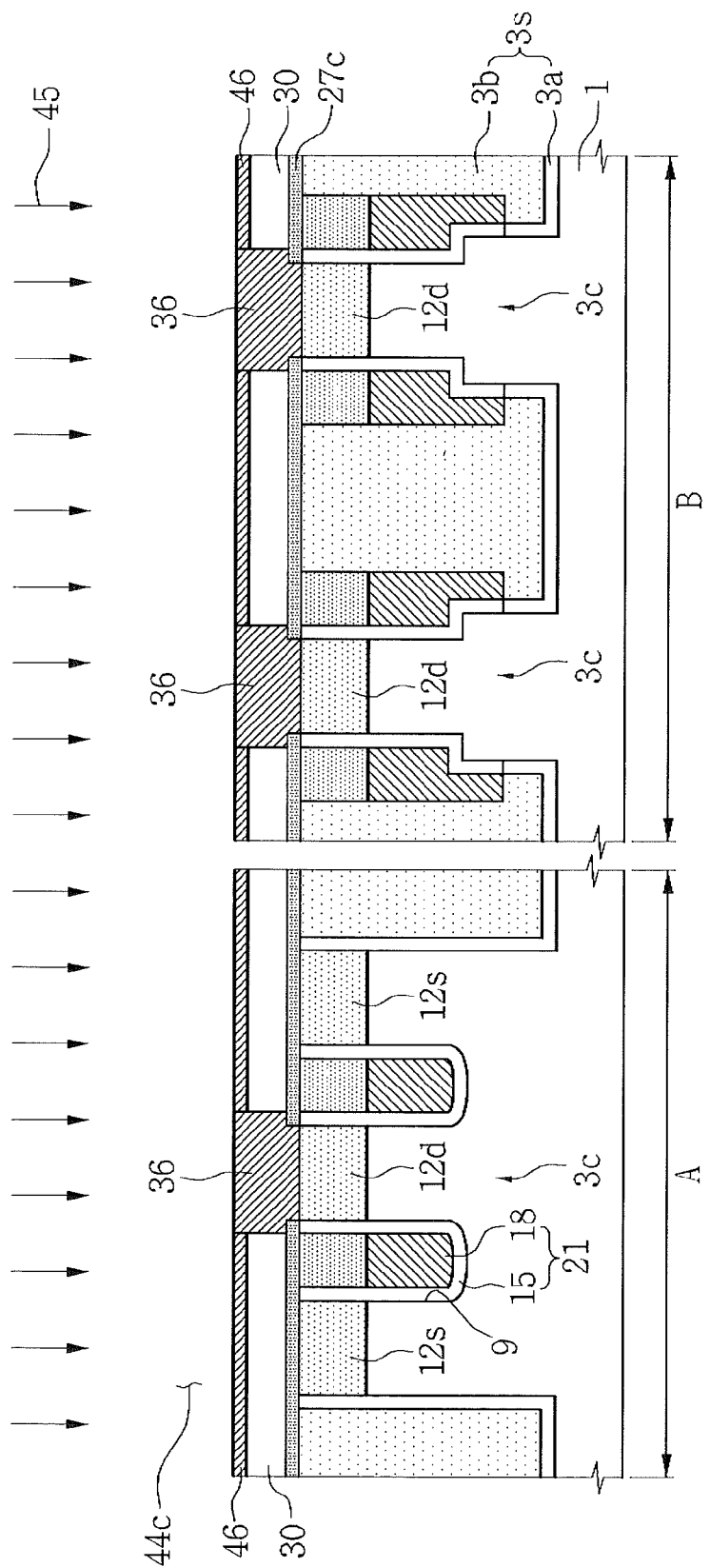
Figure 8B:
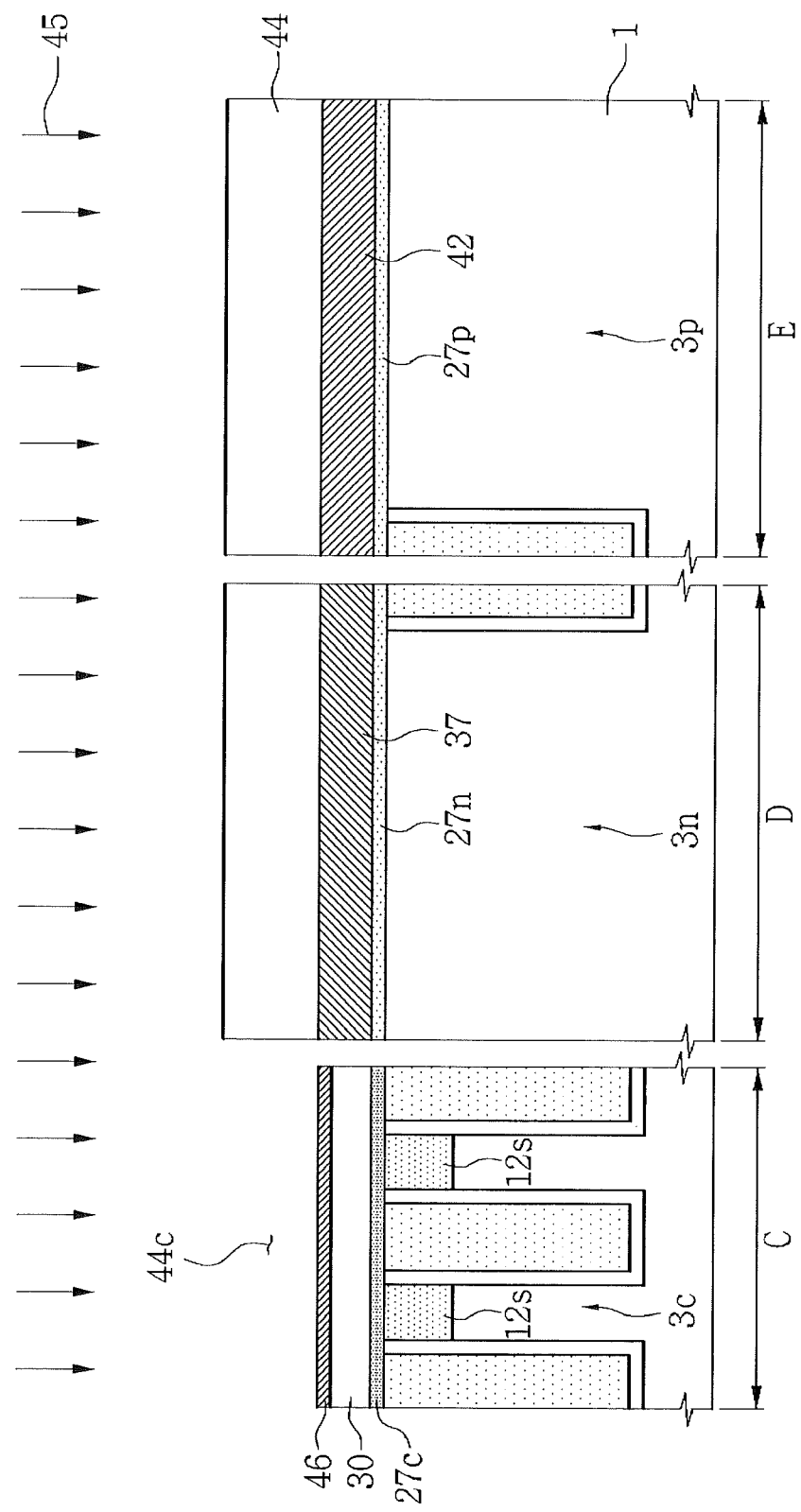

Referring to FIGS. 2, 8A, and 8B, the second ion implantation mask 39 of FIGS. 7A and 7B may be removed. A third ion implantation mask 44 may be formed on the semiconductor substrate 1 from which the second ion implantation mask 39 is removed. The third ion implantation mask 44 may be formed to have a fourth opening 44c exposing the first silicon layer 30 disposed on the first circuit region M. The third ion implantation mask 44 may be formed to be a photoresist pattern.

A third ion implantation process 45 may be performed to implant third impurity ions into an upper region of the first silicon layer 30 exposed by the fourth opening 44c. Thus, a silicon buffer region 46 may be formed in the upper region of the first silicon layer 30 exposed by the fourth opening 44c. The silicon buffer region 46 may have the same conductivity type as the first silicon region 36.

Although the first through third ion implantation processes 34, 40, and 45 may be performed in this order, the present inventive concept is not limited thereto. For example, each of the first through third ion implantation processes 34, 40, and 45 may be performed in any order.

According to some example embodiments, the third ion implantation process 45 may be omitted.

Figure 9A:
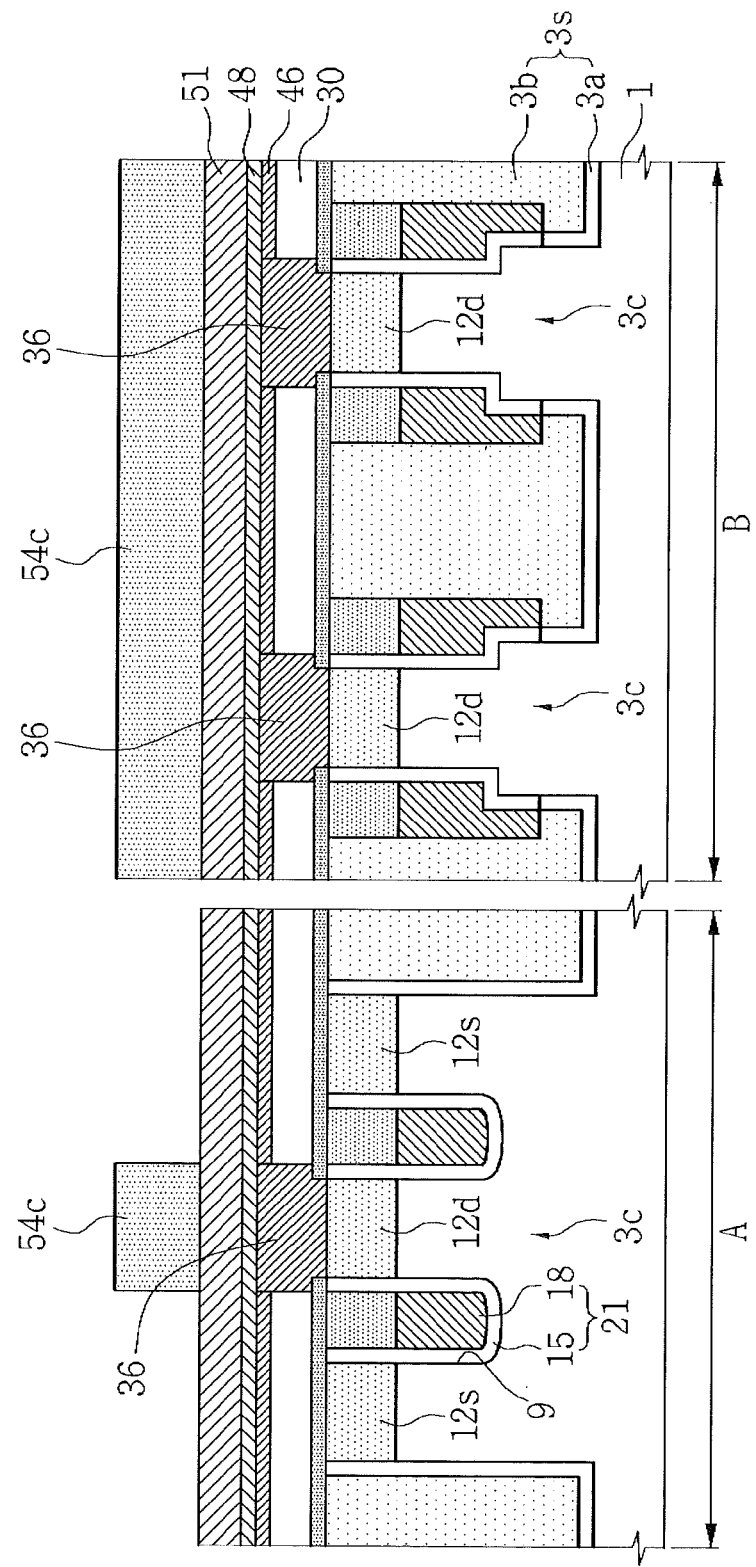
Figure 9B:
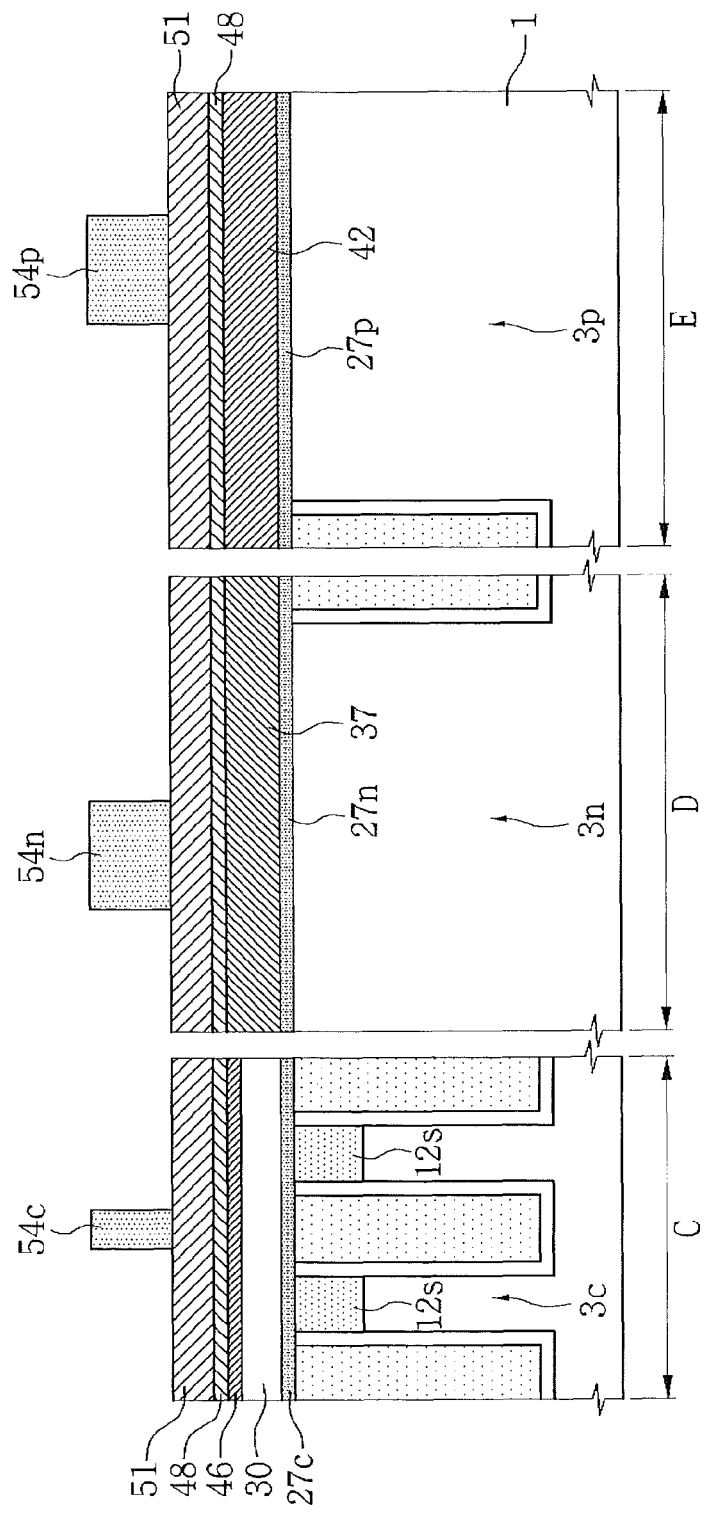

Referring to FIGS. 2, 9A, and 9B, the third ion implantation mask 44 of FIGS. 8A and 8B may be removed. Thereafter, an annealing process may be performed to activate impurity ions doped into the first through third silicon regions 36, 37, and 42 and the silicon buffer region 46.

Thereafter, a metal layer 51 may be formed on the semiconductor substrate 1 having the first through third silicon regions 36, 37, and 42 and the silicon buffer region 46. The metal layer 51 may be formed of a metal having a lower resistivity than the first through third silicon regions 36, 37, and 42. For example, the metal layer 51 may be formed of a W layer.

According to some example embodiments, before forming the metal layer 51, a metal buffer layer 48 may be formed on the semiconductor substrate 1 having the first through third silicon regions 36, 37, and 42 and the silicon buffer region 46. The metal buffer layer 48 may be formed to include at least one of a metal nitride and a metal-semiconductor compound. For instance, the metal buffer layer 48 may be formed by sequentially stacking a TiN layer and a WSi layer.

Capping masks 54c, 54n, and 54p may be formed on the metal layer 51. The capping masks 54c, 54n, and 54p may be divided into a first capping mask 54c, a second capping mask 54n, and a third capping mask 54p formed on the first circuit region M, the second circuit region N, and the third circuit region P, respectively. The first through third capping masks 54c, 54n, and 54p may be formed of an insulating material layer, such as a silicon nitride layer.

Figure 10A:
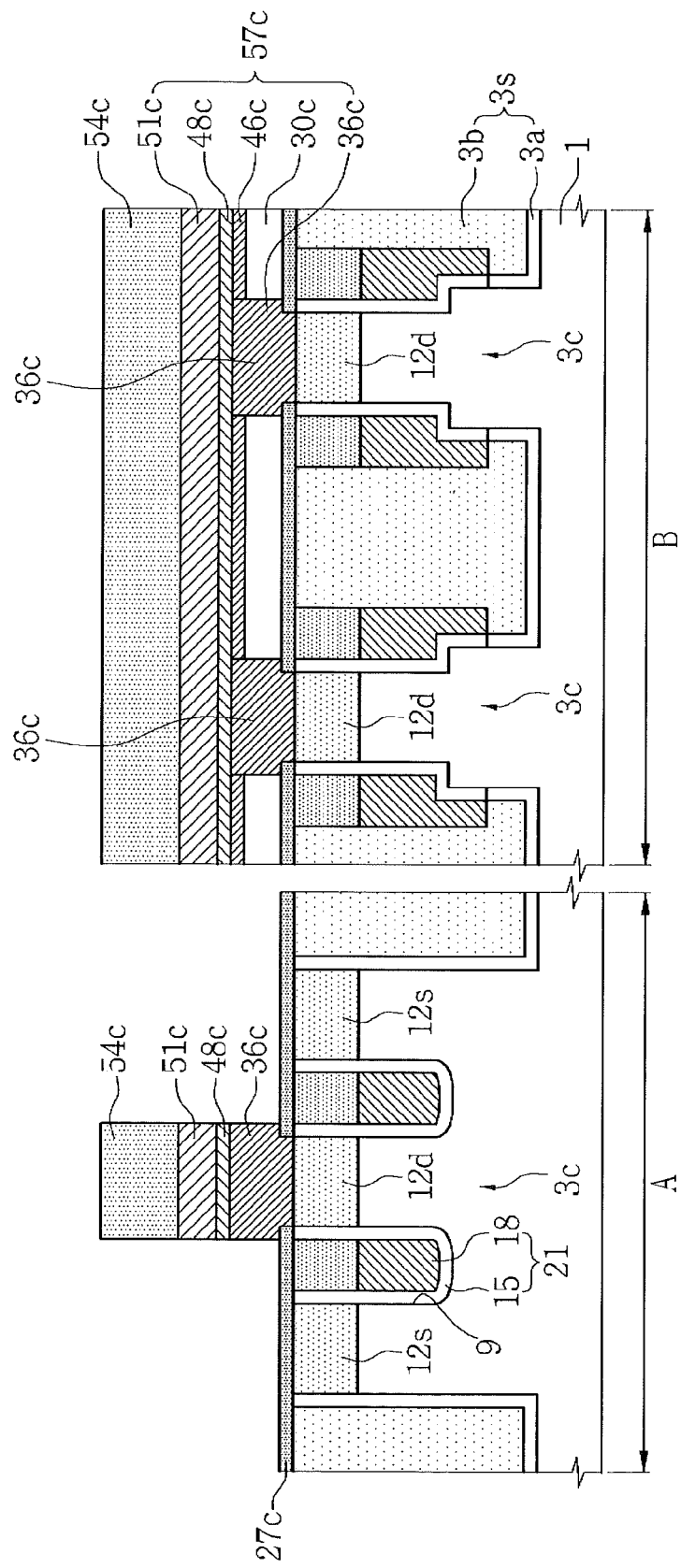
Figure 10B:
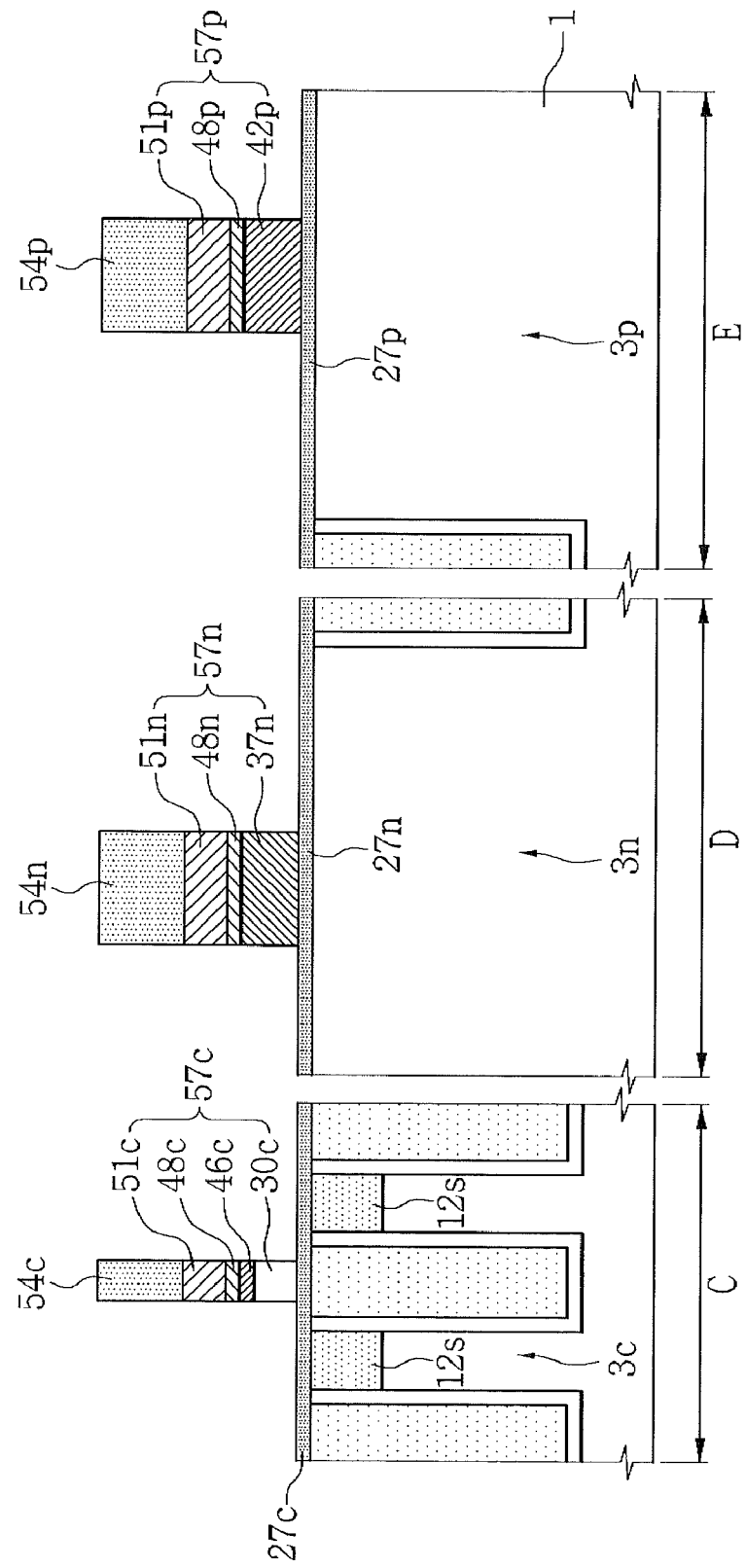

Referring to FIGS. 2, 10A, and 10B, the metal layer 51, the metal buffer layer 48, the silicon layer 30, and the first through third silicon regions 36, 37, and 42 and the silicon buffer region 46, which are formed in the silicon layer 30, may be patterned using the first through third capping masks 54c, 54n, and 54p as an etch mask. As a result, a first interconnection 57c may be formed on the first circuit region M, a second gate structure 57n may be formed on the second circuit region N across the second active region 3n, and a third gate structure 57p may be formed on the third circuit region P across the third active region 3c. The first interconnection 57c may be defined as a bit line of a memory device, such as a DRAM. The second gate structure 57n may correspond to the second interconnection 525b described with reference to FIG. 1.

The first interconnection 57c may include a first silicon pattern 36c, 30c, and 46c, a first metal buffer pattern 48c, and a first metal pattern 51c that are stacked sequentially. The second gate structure 57n may include a second silicon pattern 37n, a second metal buffer pattern 48n, and a second metal pattern 51n that are stacked sequentially. The third gate structure 57p may include a third silicon pattern 42p, a third metal buffer pattern 48p, and a third metal pattern 51p that are stacked sequentially.

The first silicon pattern 36c, 30c, and 46c may include contact regions 36c spaced apart from each other, a first silicon interconnection region 30c interposed between the contact regions 36c, and a doped silicon buffer region 46c disposed on the first silicon interconnection region 30c. The contact regions 36c may be electrically connected to any one region 12d of the first source and drain regions 12s and 12d.

The contact regions 36c may be formed to have a lower resistivity than the first silicon interconnection region 30c. The second silicon pattern 37n may be formed to have a lower resistivity than the first silicon interconnection region 30c. The contact regions 36c and the second silicon pattern 37n may be formed to have the same conductivity type and the same dopant concentration. Thus, the contact regions 36c and the second silicon pattern 37n may be formed to have the same resistivity.

Figure 11A:
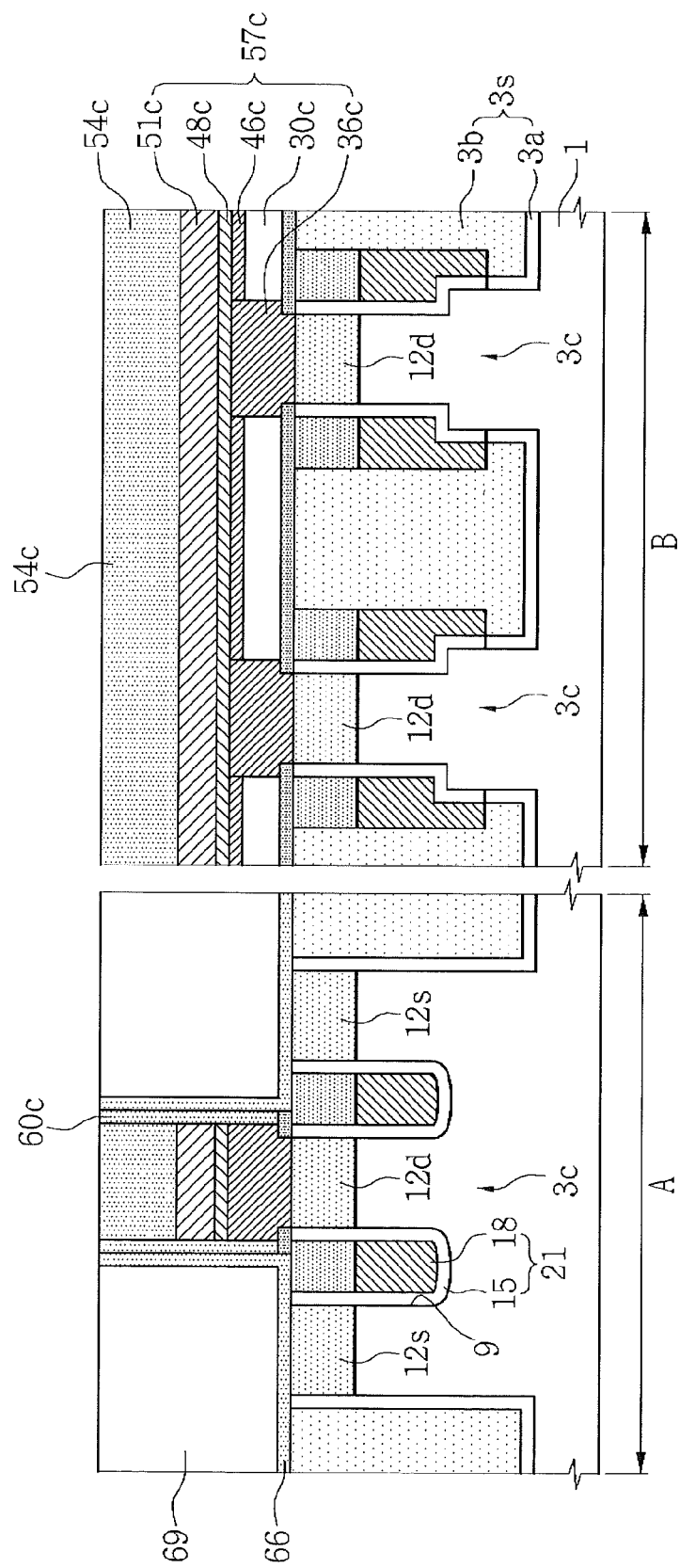
Figure 11B:
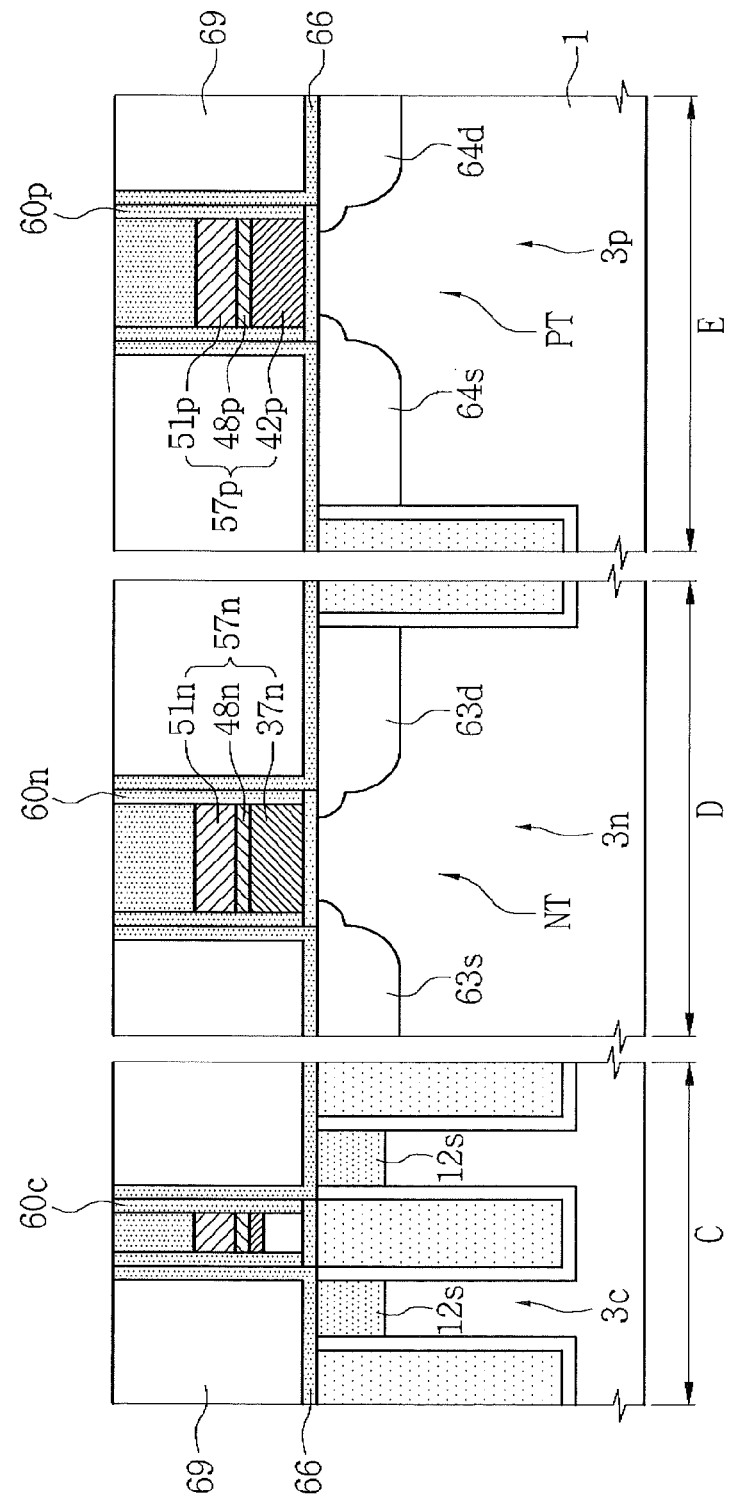

Referring to FIGS. 2, 11A, and 11B, a first spacer 60c may be formed to cover sidewalls of the first interconnection 57c and the first capping mask 54c, a second spacer 60n may be formed to cover sidewalls of the second gate structure 57n and the second capping mask 54n, and a third spacer 60p may be formed to cover sidewalls of the third gate structure 57p and the third capping mask 54p. The first through third spacers 60c, 60n, and 60p may be formed to include at least one of a silicon oxide layer and a silicon nitride layer.

Second source and drain regions 63s and 63d may be formed in the second active region 3n on both sides of the second gate structure 57n. Thus, a second MOS transistor NT including the second gate dielectric layer 27n, the second gate structure 57n, and the second source and drain regions 63s and 63d may be formed on the second circuit region N. The second MOS transistor NT may be an NMOS transistor.

Third source and drain regions 64s and 64d may be formed in the third active region 3p on both sides of the third gate structure 57p. Thus, a third MOS transistor PT including the third gate dielectric layer 27p, the third gate structure 57p, and the third source and drain regions 64s and 64p may be formed on the third circuit region P. The third MOS transistor PT may be a PMOS transistor.

An etch stop layer 66 may be formed on the entire surface of the semiconductor substrate 1 having the second and third MOS transistors NT and PT. Thereafter, an interlayer insulating layer 69 may be formed on the semiconductor substrate 1 having the etch stop layer 66. The interlayer insulating layer 69 may be formed of a silicon oxide layer and/or a low-k dielectric layer having a lower dielectric constant than the silicon oxide layer. The etch stop layer 66 may be formed of an insulating material having an etch selectivity with respect to the interlayer insulating layer 69. For example, when the interlayer insulating layer 69 is formed of a silicon oxide layer, the etch stop layer 66 may be formed of a silicon nitride layer.

According to some example embodiments, the formation of the interlayer insulating layer 69 may include forming an insulating material layer on the semiconductor substrate 1 having the etch stop layer 66 and planarizing the insulating layer until top surfaces of the first through third capping masks 54c, 54n, and 54p are exposed.

According to other example embodiments, the formation of the interlayer insulating layer 69 may include forming an insulating material layer on the semiconductor substrate 1 having the etch stop layer 66 and planarizing the insulating material layer not to expose top surfaces of the first through third capping masks 54c, 54n, and 54p.

Referring to FIGS. 2, 12A, and 12B, a first contact hole 71c may be formed on the first circuit region M to penetrate the interlayer insulating layer 69 and the etch stop layer 66 and expose the region 12s of the first source and drain regions 12s and 12d which is not connected to the first interconnection 57c. A first contact structure 72c may be formed to fill the first contact hole 71c. The first contact structure 72c may be formed to include at least one of a doped poly-Si layer and a metal layer.

A second contact hole 71n may be formed on the second circuit region N to penetrate the interlayer insulating layer 69 and the etch stop layer 66 and expose at least one of the second source and drain regions 63s and 63d. A second contact structure 72n may be formed to fill the second contact hole 71n.

A third contact hole 71p may be formed on the third circuit region P to penetrate the interlayer insulating layer 69 and the etch stop layer 66 and expose at least one of the third source and drain regions 64s and 64d. A third contact structure 72p may be formed to fill the third contact structure 72p.

The first through third contact holes 71c, 71n, and 71p may be formed simultaneously or separately. For example, the first through third contact structures 72c, 72n, and 72p may be formed simultaneously or separately. For example, the first through third contact structures 72c, 72n, and 72p may be formed of the same material simultaneously. Thus, the first through third contact structures 72c, 72n, and 72p may be formed of the same material, for example, an n-type doped poly-Si layer. A buffer pattern 75c may be formed on the first contact structure 72c. A first conductive pattern 75n may be formed on the second contact structure 72n, while a second conductive pattern 75p may be formed on the third contact structure 72p. The buffer pattern 75c and the first and second conductive patterns 75n and 75p may be formed to include at least one of a doped poly-Si layer and a metal layer.

A data storage element 78 may be formed on the buffer pattern 75c. The data storage element 78 may be a data storage unit of a volatile memory device or a nonvolatile memory device. For example, the data storage element 78 may be a capacitor of a DRAM including a first electrode, a capacitor dielectric material, and a second electrode.

The present inventive concept is not limited to the above-described example embodiments and may be embodied in different forms. Hereinafter, methods of forming the first contact structures 36c according to other example embodiments will be described with reference to FIGS. 13A through 17B.

Figure 13A:
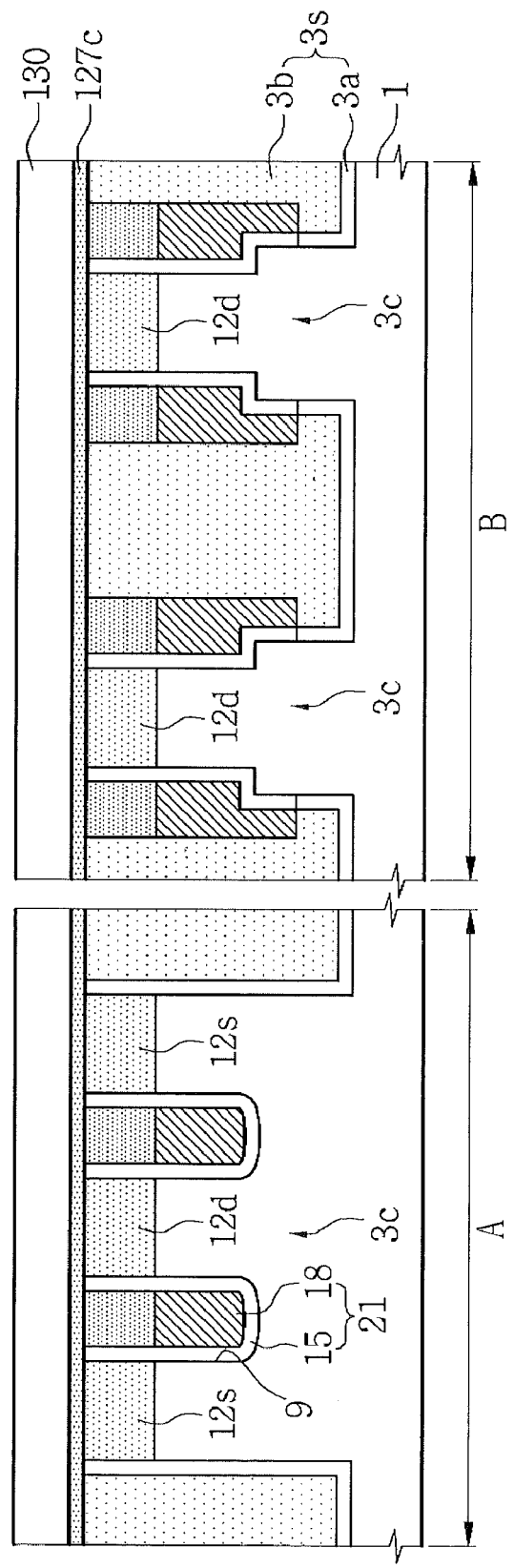
FIGS. 13A through 17B are cross-sectional views illustrating a method of fabricating a semiconductor device according to other example embodiments.
Figure 13B:
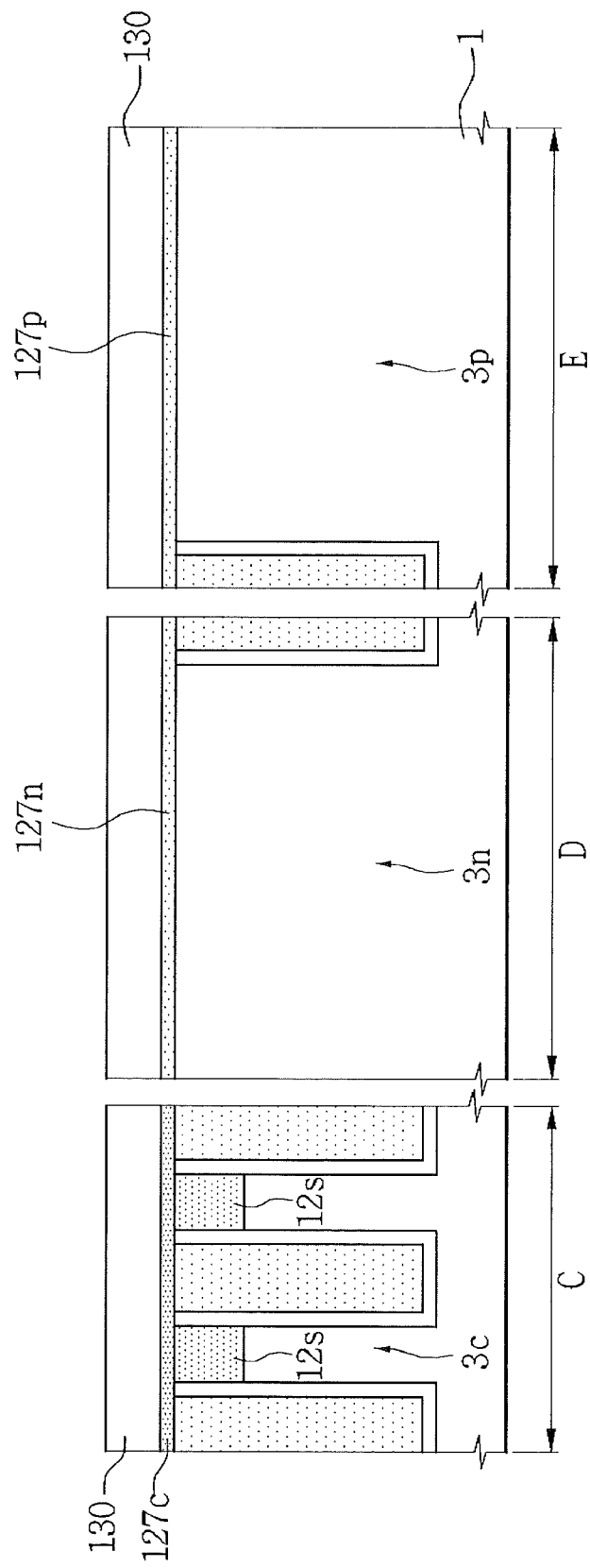

Referring to FIGS. 2, 13A, and 13B, a semiconductor substrate fabricated using substantially the same method as described with reference to FIGS. 3A through 4B may be prepared. For example, a semiconductor substrate having the first MOS transistor CT and the first gate capping pattern 24 described with reference to FIGS. 4A and 4B may be prepared.

A second gate dielectric layer 127n may be formed on the second circuit region N of the semiconductor substrate 1 having the first MOS transistor CT and the first gate capping pattern 24. The second gate dielectric layer 127n may be formed to include at least one of a silicon oxide layer and a high-k dielectric layer. A third gate dielectric layer 127p may be formed on the third circuit region P of the semiconductor substrate 1. The third gate dielectric layer 127p may be formed to include at least one of a silicon oxide layer and a high-k dielectric layer. The second and third gate dielectric layers 127n and 127p may be formed using substantially the same method as the second and third gate dielectric layers 127n and 127p of FIGS. 4A and 4B.

Meanwhile, while forming the second and third gate dielectric layers 127n and 127p, a buffer insulating layer 127c may be formed on the first circuit region M of the semiconductor substrate 1.

A first silicon layer 130 having a first resistivity may be formed on the entire surface of the semiconductor substrate 1 having the second and third gate dielectric layers 127n and 127p. The first silicon layer 130 may be formed of a poly-Si layer.

According to some example embodiments, the first silicon layer 130 may be formed of undoped silicon or intrinsic silicon.

According to other example embodiments, the first silicon layer 130 may be formed of doped silicon of a first conductivity type.

Figure 14A:
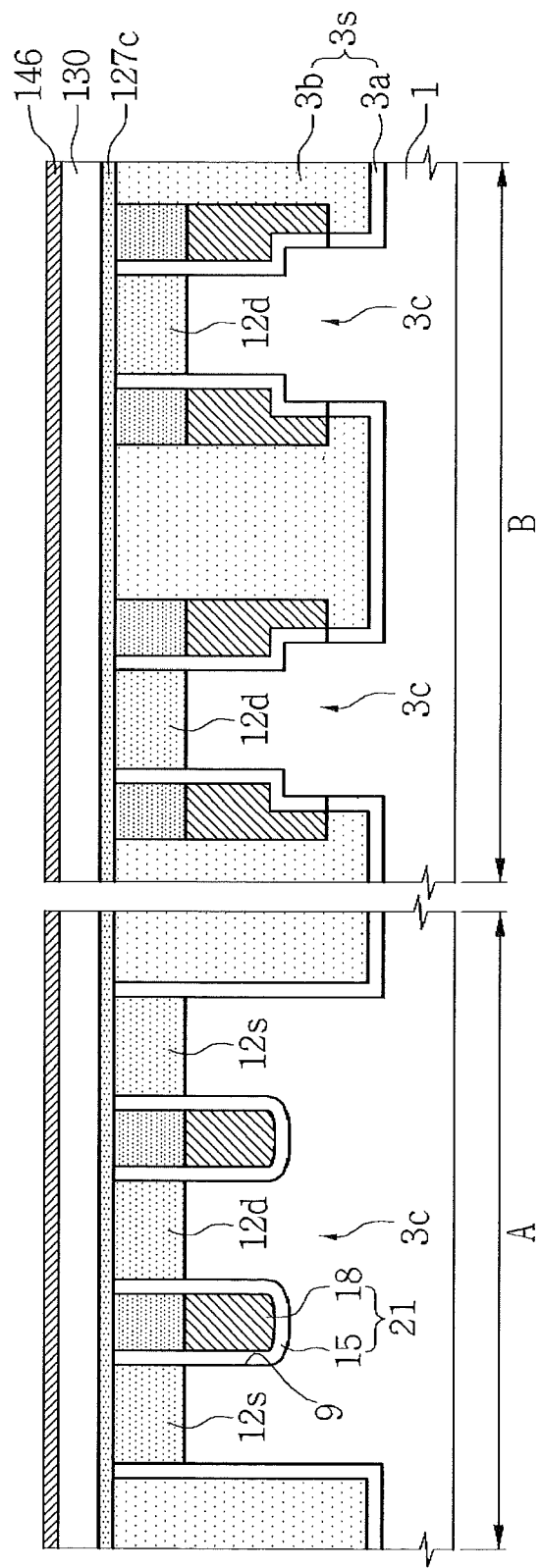
Figure 14B:
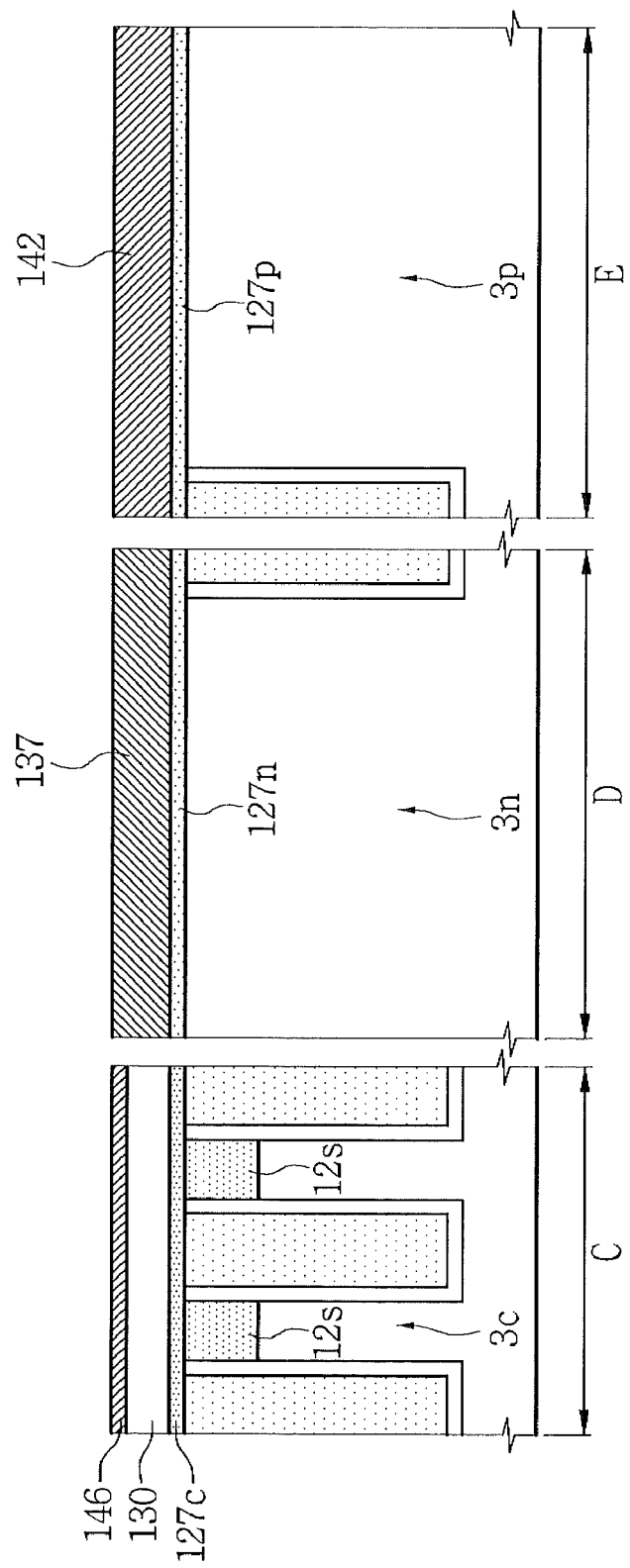

Referring to FIGS. 2, 14A, and 14B, first impurity ions may be implanted into the first silicon layer 130 of the second circuit region N, thereby forming a second silicon region 137. Second impurity ions may be implanted into the first silicon layer 130 of the third circuit region P, thereby forming a third silicon region 142. The second and third silicon regions 137 and 142 may have different conductivity types. For example, when the second silicon region 137 is formed to be an n-type silicon region, the third silicon region 142 may be formed to be a p-type silicon region.

According to some example embodiments, a third ion implantation process 45 described with reference to FIGS. 8A and 8B may be performed, thereby forming a silicon buffer region in an upper region of the first silicon layer 130 of the first circuit region M. The silicon buffer region 146 may be formed to have a lower resistivity than the first silicon layer 130.

Figure 15A:
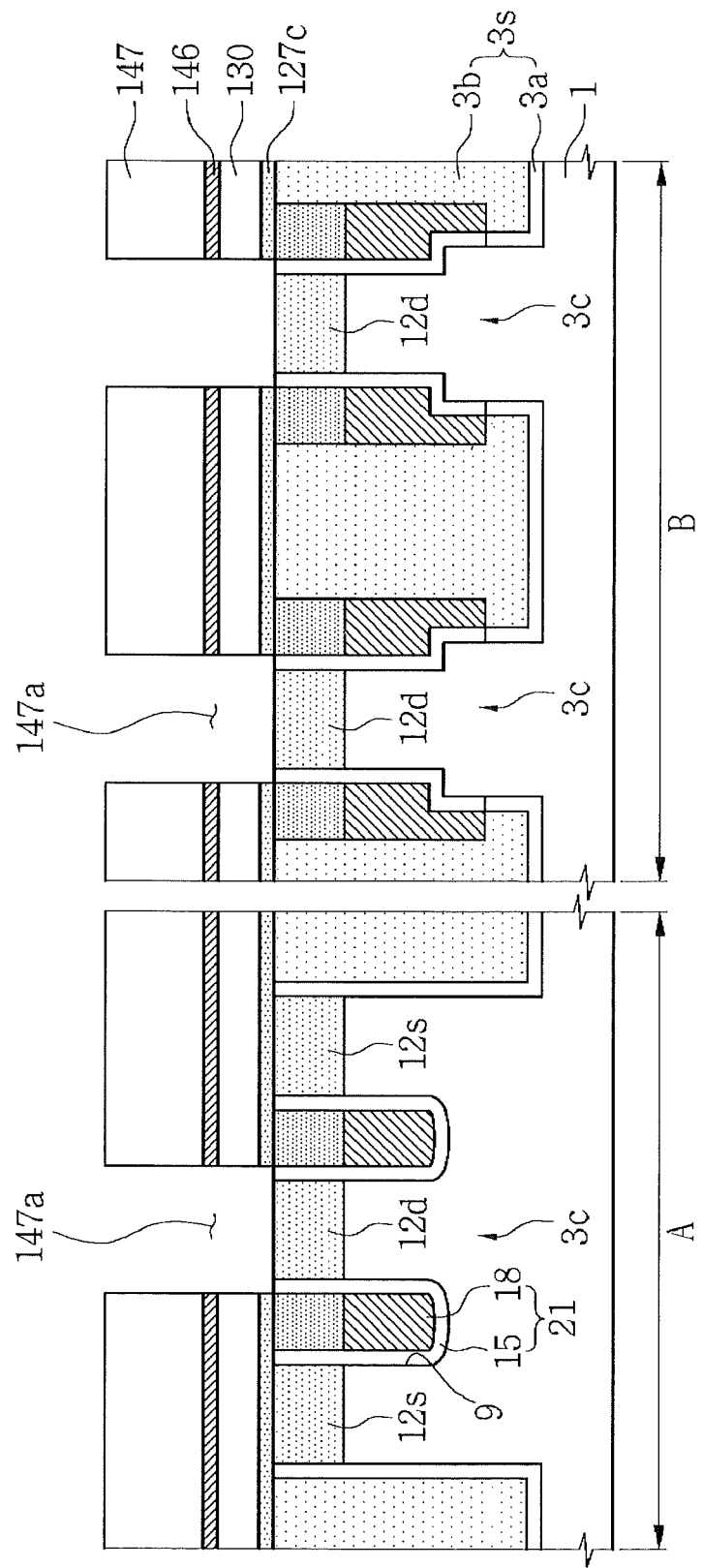
Figure 15B:
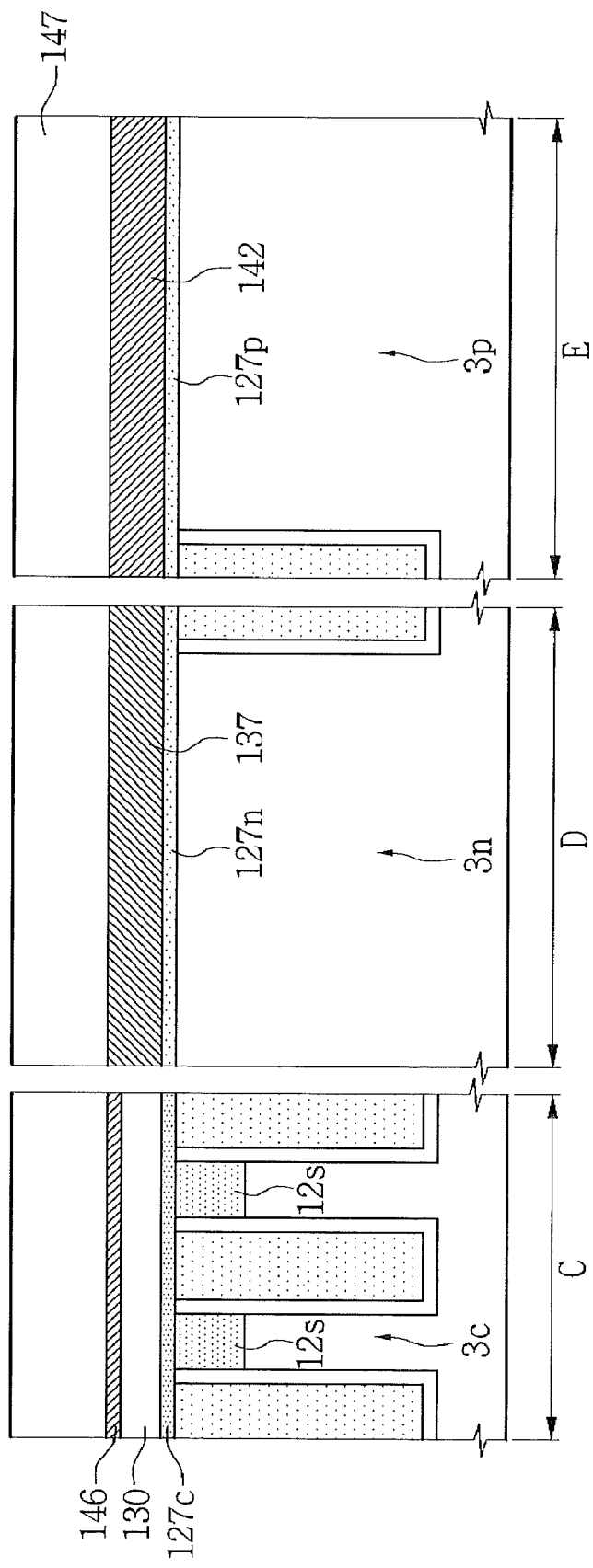

Referring to FIGS. 2, 15A, and 15B, a mask 147 may be formed on the semiconductor substrate 1 having the first silicon layer 130. The mask 147 may have openings exposing a predetermined region of the first silicon layer that overlaps one region 12d of the first source and drain regions 12s and 12d. The first silicon layer 130 may be etched using the mask 147 as an etch mask, thereby forming openings 147a exposing the region 12d of the first source and drain regions 12s and 12d.

The mask 147 may be formed to be a photoresist pattern or a hard mask formed of a silicon nitride layer.

Referring to FIGS. 2, 16A, and 16B, first interconnection contact regions 136c may be formed to fill the openings 147a. The first interconnection contact regions 136c may be formed of highly doped silicon. In this case, the first interconnection contact regions 136c formed of doped silicon may have a lower resistivity than the first silicon layer 130.

According to some example embodiments, the first interconnection contact regions 136c may be formed of a conductive material, such as a metal, a metal nitride, or a metal-semiconductor compound, instead of doped silicon. The metal may be W, titanium (Ti), or tantalum (Ta). The metal nitride may be a W nitride, a Ti nitride, or a Ta nitride. The metal-semiconductor compound may be a W silicide, a Ti silicide, or a Ta silicide.

The mask 147 may be removed. The mask 147 may be removed before forming the first interconnection contact regions 136c. Alternatively, the mask 147 may be removed after forming the first interconnection contact regions 136c.

A metal buffer layer 148 and a metal layer 151 may be formed on the entire surface of the semiconductor substrate 1 having the first interconnection contact regions 136c as described with reference to FIGS. 9A and 9B. Thereafter, a capping mask material layer 154 may be formed on the metal layer 151.

Referring to FIGS. 2, 17A, and 17B, the capping mask material layer 154 may be patterned, thereby forming first through third capping masks 154c, 154n, 154p as described with reference to FIGS. 9A and 9B. The metal layer 151, the metal buffer layer 148, and the second and third silicon regions 137 and 142 and the silicon buffer region 146 formed in the silicon layer 130 may be patterned using the first through third capping masks 154c, 154n, and 154p as an etch mask. As a result, a first interconnection 157c may be formed on the first circuit region M, a second gate structure 157n may be formed on the second circuit region N across the second active region 3n, and a third gate structure 157p may be formed on the third circuit region P across the third active region 3p.

The first interconnection 157 may include the first interconnection contact regions 136c, a first silicon interconnection region 130c formed between the first interconnection contact regions 136c, and a doped silicon buffer region 146c formed on the first silicon interconnection region 130c. Furthermore, the first interconnection 157c may include a first metal buffer pattern 148, which is formed on the doped silicon buffer region 146c and the first interconnection contact regions 136c, and a first metal pattern 151c formed on the first metal buffer pattern 148c. Each of the first interconnection contact regions 136c may be electrically connected to the region 12d of the first source and drain regions 12s and 12d.

The second gate structure 157n may include a second silicon pattern 137n, a second metal buffer pattern 148c, and a second metal pattern 151 that are stacked sequentially. The third gate structure 157p may include a third silicon pattern 142p, a third metal buffer pattern 148p, and a third metal pattern 151p that are stacked sequentially.

Thereafter, as described with reference to FIGS. 11A and 11B, a first spacer 160c may be formed to cover sidewalls of the first interconnection 157c and the first capping mask 154c. A second spacer 160n may be formed to cover sidewalls of the second gate structure 157n and the second capping mask 154n. A third spacer 160p may be formed to cover sidewalls of the third gate structure 157p and the third capping mask 154p.

Second source and drain regions 163s and 163d may be formed in the second active region 3n on both sides of the second gate structure 157n. Thus, a second MOS transistor NT2 including the second gate dielectric layer 127n, the second gate structure 157n, and the second source and drain regions 163s and 163d may be formed in the second circuit region N. The second MOS transistor NT2 may be an NMOS transistor.

Third source and drain regions 164s and 164d may be formed in the third active region 3p on both sides of the third gate structure 157p. Thus, a third MOS transistor PT2 including the third gate dielectric layer 127p, the third gate structure 157p, and the third source and drain regions 164s and 164d may be formed in the third circuit region P. The third MOS transistor PT2 may be a PMOS transistor.

Thereafter, as described with reference to FIGS. 11A and 11B, an etch stop layer 166 may be formed on the entire surface of the semiconductor substrate 1 having the second and third MOS transistors NT2 and PT2. An interlayer insulating layer 169 may be formed on the semiconductor substrate 1 having the etch stop layer 166.

Thereafter, as described with reference to FIGS. 12A and 12B, a first contact structure 172c may be formed on the first circuit region M through the interlayer insulating layer 169 and the etch stop layer 166. The first contact structure 172c may be connected to the region 12s of the first source and drain regions 12s and 12d which is not connected to the first interconnection 157c. A second contact structure 172n may be formed on the second circuit region N through the interlayer insulating layer 169 and the etch stop layer 166. The second contact structure 172n may be connected to at least one of the second source and drain regions 163s and 163d. A third contact structure 172p may be formed on the third circuit region P through the interlayer insulating layer 169 and the etch stop layer 166. The third contact structure 172p may be connected to at least one of the third source and drain regions 164s and 164d. The first through third contact structures 172c, 172n, and 172p may be formed to include at least one of a doped poly-Si layer and a metal layer.

A buffer pattern 175c may be formed on the first contact structure 172c. A first conductive pattern 175n may be formed on the second contact structure 172n, and a second conductive pattern 175p may be formed on the third contact structure 172p. The buffer pattern 175c and the first and second conductive patterns 175n and 175p may be formed to include at least one of a doped poly-Si layer and a metal layer.

A data storage element 178 may be formed on the buffer pattern 175c. The data storage element 178 may be a data storage unit of a volatile memory device or a nonvolatile memory device. For example, the data storage element 178 may be a capacitor of a DRAM including a first electrode, a dielectric material, and a second electrode.

Hereinafter, methods of forming the first contact regions 36*c* and 136*c* according to other example embodiments will be described with reference to FIGS. 18 and 19.

To begin, referring to FIG. 18, a substrate fabricated using the process described with reference to FIGS. 15A and 15B may be prepared. That is, as shown in FIGS. 15A and 15B, a mask 147 may be formed on the semiconductor substrate 1 having the first silicon layer 130. The mask 147 may have openings exposing a predetermined region of the first silicon layer 130 that overlaps one region 12*d* of the first source and drain regions 12*s* and 12*d*. The first silicon layer 130 may be etched using the mask 147 as an etch mask, thereby forming openings 147*a* exposing the region 12*d* of the first source and drain regions 12*s* and 12*d*.

According to some example embodiments, a plug ion implantation process may be performed on the region 12*d* of the first source and drain regions 12*s* and 12*d*, which is exposed by the openings 147*a*.

The mask 147 of FIGS. 15A and 15B may be removed.

Thereafter, as described with reference to FIGS. 16A and 16B, a metal buffer layer 148, a metal layer 151, and a capping mask material layer 154 may be sequentially formed on the semiconductor substrate 1 having the openings 147*a*. Thus, the metal buffer layer 148 and the metal layer 151 may be formed on the first silicon layer 130 to fill the openings 147*a*. The metal buffer layer 148 and the metal layer 151, which fill the opening 147*a*, may be defined as a contact region.

According to some example embodiments, a silicidation process may be performed on the region 12*d* of the first source and drain regions 12*s* and 12*d*, which is exposed by the openings 147*a*, to form an ohmic contact. For example, a metal layer may be formed on the semiconductor substrate 1 having the openings 147*a* and annealed so that the exposed region 12*d* of the first source and drain regions 12*s* and 12*d* may react with the metal layer to form a metal-semiconductor compound, namely, a metal silicide layer (not shown).

Referring to FIG. 19, substantially the same process as described with reference to FIGS. 17A and 17B may be performed. For example, a capping mask material layer 254 may be patterned, thereby forming a capping mask 254*c* as described with reference to FIGS. 17A and 17B. The metal layer 251, the metal buffer layer 248, the silicide layer 230, and the silicon buffer region 146 may be patterned using the capping mask 254*c* as an etch mask. As a result, a first interconnection 157*c* may be formed on the first circuit region M. Although FIGS. 18 and 19 do not illustrate regions corresponding to the second and third circuit regions N and P, it may be inferred that the regions corresponding to the second and third circuit regions N and P are substantially the same as shown in FIGS. 16B and 17B.

The first interconnection 257*c* may include contact regions 236*c*, a first silicon interconnection region 230*c* formed between the contact regions 236*c*, a silicon buffer region 246*c* formed on the first silicon interconnection region 230*c*, a first metal buffer pattern 248*c* formed on the silicon buffer region 246*c*, and a first metal pattern 251*c* formed on the first metal buffer pattern 248*c*. Here, the contact regions 236*c* and the first metal pattern 251*c* may be formed of the same material. Also, the contact regions 236*c* may extend from the first metal pattern 251*c*. Thus, the contact regions 36*c* of FIG. 12A may be formed of doped silicon, while the contact regions 236*c* according to the present example embodiments may be formed of the same material as the first metal pattern 251*c*, for example, a metal such as W.

Thereafter, an etch stop layer 266 may be formed on the semiconductor substrate 1 having the above-described resultant structure, and an interlayer insulating layer 269 may be formed on the semiconductor substrate 1 having the etch stop layer 266. A first contact structure 172*c* may be formed on the first circuit region M through the interlayer insulating layer 269 and the etch stop layer 266. The first contact structure 172*c* may be connected to the region 12*s* of the first source and drain regions 12*s* and 12*d*, which is not connected to the first interconnection 257*c*. A buffer pattern 275*c* may be formed on the first contact structure 272*c*. A data storage element 278 may be formed on the buffer pattern 275*c*. The data storage element 278 may be a data storage unit of a volatile memory device or a nonvolatile memory device.

According to example embodiments, a first interconnection including a first silicon interconnection region and a second metal interconnection region that are stacked sequentially may be provided in a circuit region more crowded with interconnections, while a second interconnection including a second silicon interconnection region and a second metal interconnection region that are stacked sequentially may be provided in a circuit region less crowded with interconnections. The second silicon interconnection region may have a lower resistivity than the first silicon interconnection region. Thus, the second interconnection having a high resistance may be provided in the circuit region less crowded with the interconnections, while the first interconnection capable of reducing the loading capacitance of interconnections may be provided in the circuit region more crowded with the interconnections. As a result, the electrical properties of the interconnections may be improved, thereby enhancing the overall performance of semiconductor devices.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:
1. A semiconductor device comprising:
a first interconnection including a first silicon interconnection region and a first metal interconnection region stacked sequentially on a substrate; and
a second interconnection including a second silicon interconnection region and a second metal interconnection region stacked sequentially on the substrate,
wherein a bottom surface of the second silicon interconnection region is disposed at substantially the same level as a bottom surface of the first silicon interconnection region, and
wherein the second silicon interconnection region has a lower resistivity than the first silicon interconnection region.

2. The device of claim 1, wherein the first silicon interconnection region is formed of undoped silicon or intrinsic silicon, and the second silicon interconnection region is formed of doped silicon.

3. The device of claim 1, wherein the first and second silicon interconnection regions are formed of doped silicon of the same conductivity type, and the second silicon interconnection region is formed of doped silicon having a higher dopant concentration than the first silicon interconnection region.

4. The device of claim 1, further comprising a doped silicon buffer region interposed between the first silicon interconnection region and the first metal interconnection region and having a lower resistivity than the first silicon interconnection region.

5. The device of claim 1, wherein the first silicon interconnection region has a smaller width than the second silicon interconnection region.

6. The device of claim 1, further comprising:
a first metal buffer region interposed between the first silicon interconnection region and the first metal interconnection region; and
a second metal buffer region interposed between the second silicon interconnection region and the second metal interconnection region,
wherein a thickness of the first silicon interconnection region is greater than a thickness of the first metal buffer region, and
wherein a thickness of the second silicon interconnection region is greater than a thickness of the second metal buffer region.

7. A semiconductor device comprising:
a semiconductor substrate having first and second circuit regions;
a first MOS transistor disposed on the first circuit region of the semiconductor substrate and including a first gate structure and first source and drain regions;
a contact region electrically connected to one of the first source and drain regions;
a first silicon interconnection region connected to the contact region and having a higher resistivity than the contact region;
a first metal interconnection region disposed on the contact region and the first silicon interconnection region;
a second silicon interconnection region disposed on the second circuit region of the semiconductor substrate and having a lower resistivity than the first silicon interconnection region; and
a second metal interconnection region disposed on the second silicon interconnection region.

8. The device of claim 7, wherein the first MOS transistor comprises:
first source and drain regions disposed in a first active region defined by an isolation region formed in the semiconductor substrate, the first source and drain regions spaced apart from each other; and
a first gate structure configured to partially fill a gate trench that runs across the first active region between the first source and drain regions and extends to the isolation region,
wherein the first and second silicon interconnection regions are disposed at a higher level than the first gate structure.

9. The device of claim 8, wherein the first gate structure partially fills the gate trench disposed across the first active region and extends to the isolation region to cover sidewalls of the first active region at a lower level than a bottom region of the gate trench of the first active region.

10. The device of claim 8, further comprising a second MOS transistor disposed on the second circuit region of the semiconductor substrate and including a second gate structure and second source and drain regions,
wherein the second MOS transistor includes: a second gate dielectric layer and a second gate structure stacked sequentially on a second active region defined by the isolation region disposed in the semiconductor substrate; and second source and drain regions disposed in the second active region on both sides of the second gate structure,
wherein the second gate structure includes the second silicon interconnection region and the second metal interconnection region.

11. The device of claim 7, wherein a bottom surface of the second silicon interconnection region is disposed at substantially the same level with a bottom surface of the first silicon interconnection region, and the second metal interconnection region is formed of the same material as the first metal interconnection region.

12. The device of claim 7, wherein the first and second silicon interconnection regions are formed of doped silicon of the same conductivity type, and the second silicon interconnection region is formed of doped silicon having a higher dopant concentration than the first silicon interconnection region.

13. The device of claim 7, wherein the contact region is formed of doped silicon or the same material as the first metal interconnection region.

14. The device of claim 7, wherein the first silicon interconnection region is formed of undoped silicon or intrinsic silicon.

15. The device of claim 7, further comprising a doped silicon buffer region interposed between the first silicon interconnection region and the first metal interconnection region and having a lower resistivity than the first silicon interconnection region.

16. The device of claim 7, wherein a width of the contact region is greater than a width of the first silicon interconnection region.

17. The device of claim 7, wherein the first silicon interconnection region includes a first portion and a second portion,
wherein the first portion of the first silicon interconnection region is spaced apart from the second portion of the first silicon interconnection region,
wherein the contact region is interposed between the first portion of the first silicon interconnection region and the second portion of the first silicon interconnection region.

18. The device of claim 7, wherein a top surface of the contact region is disposed at a higher level than a top surface of the first silicon interconnection region.

19. The device of claim 7, wherein a bottom surface of the contact region is disposed at a lower level than a bottom surface of the first silicon interconnection region.

20. A semiconductor device comprising:
a semiconductor substrate having first and second circuit regions;
a first MOS transistor disposed on the first circuit region of the semiconductor substrate and including a first gate structure and first source and drain regions;
a contact region electrically connected to one of the first source and drain regions;
a first silicon interconnection region connected to the contact region and having a higher resistivity than the contact region;
a first metal interconnection region disposed on the first silicon interconnection region;
a second silicon interconnection region disposed on the second circuit region of the semiconductor substrate and having a lower resistivity than the first silicon interconnection region; and
a second metal interconnection region disposed on the second silicon interconnection region,
wherein the first silicon interconnection includes a first portion and a second portion spaced apart from each other, wherein the contact region is interposed between the first portion of the first silicon interconnection and the second portion of the first silicon interconnection, wherein a bottom surface of the second silicon interconnection region is disposed at substantially the same level as a bottom surface of the first silicon interconnection region, and wherein the first silicon interconnection region is disposed at a higher level than the first gate structure.

* * * * *